United States Patent
Kanematsu et al.

(10) Patent No.: US 11,469,117 B2
(45) Date of Patent: Oct. 11, 2022

(54) SUBSTRATE PROCESSING APPARATUS, AND SUBSTRATE PROCESSING METHOD

(71) Applicant: SCREEN Holdings Co., Ltd., Kyoto (JP)

(72) Inventors: Yasunori Kanematsu, Kyoto (JP); Hitoshi Nakai, Kyoto (JP); Manabu Okutani, Kyoto (JP)

(73) Assignee: SCREEN Holdings Co. Ltd.

( * ) Notice: Subject to any disclaimer, the term of this patent is extended or adjusted under 35 U.S.C. 154(b) by 72 days.

(21) Appl. No.: 16/654,482

(22) Filed: Oct. 16, 2019

(65) Prior Publication Data

US 2020/0126822 A1    Apr. 23, 2020

(30) Foreign Application Priority Data

Oct. 17, 2018 (JP) ............................. JP2018-196015

(51) Int. Cl.
| | | |
|---|---|---|
| H01L 21/67 | (2006.01) | |
| H01L 21/02 | (2006.01) | |
| H01L 21/687 | (2006.01) | |
| H01L 21/683 | (2006.01) | |
| B08B 3/04 | (2006.01) | |

(52) U.S. Cl.
CPC ........ H01L 21/67051 (2013.01); B08B 3/041 (2013.01); H01L 21/0209 (2013.01); H01L 21/02087 (2013.01); H01L 21/6838 (2013.01); H01L 21/68721 (2013.01)

(58) Field of Classification Search
CPC ........... H01L 21/67051; H01L 21/6838; H01L 21/68721
See application file for complete search history.

(56) References Cited

U.S. PATENT DOCUMENTS

| 8,851,092 B2 | 10/2014 | Yamamoto et al. ........... 134/198 |
| 9,120,120 B2 | 9/2015 | Yamamoto et al. ............ 134/56 |
| 9,873,141 B2 | 1/2018 | Fujiwara et al. |
| 11,243,469 B2 | 2/2022 | Harumoto et al. |
| 2006/0234503 A1* | 10/2006 | Yamada .............. C23C 18/1628 438/667 |

(Continued)

FOREIGN PATENT DOCUMENTS

| JP | 2000-058425 A | 2/2000 |
| JP | 2003-007669 A | 1/2003 |

(Continued)

OTHER PUBLICATIONS

Office Action dated Jun. 7, 2022 for corresponding Japanese Patent Application No. 2018-196015.

*Primary Examiner* — Natasha N Campbell
(74) *Attorney, Agent, or Firm* — Ostrolenk Faber LLP

(57) ABSTRACT

A substrate processing apparatus processes a substrate having an upper side and a rear side. The substrate processing apparatus includes a substrate holder, a filler feeder, and a first cleaning liquid feeder. The substrate holder rotates the substrate while holding a central portion of the rear side of the substrate. The filler feeder feeds filler to the upper side of the substrate held by the substrate holder. The first cleaning liquid feeder feeds a cleaning liquid to the rear side of the substrate held by the substrate holder. The first cleaning liquid feeder feeds the cleaning liquid to an area, held by the substrate holder, of the rear side of the substrate.

12 Claims, 20 Drawing Sheets

(56) References Cited

U.S. PATENT DOCUMENTS

| | | | |
|---|---|---|---|
| 2007/0009839 A1 | 1/2007 | Harumoto | 430/313 |
| 2009/0202951 A1 | 8/2009 | Yamamoto et al. | 430/322 |
| 2014/0352736 A1 | 12/2014 | Yamamoto et al. | 134/26 |
| 2016/0336169 A1 | 11/2016 | Fujiwara et al. | |
| 2017/0140917 A1* | 5/2017 | Yoshida | B08B 3/04 |
| 2017/0182515 A1* | 6/2017 | Emoto | H01L 21/67028 |
| 2018/0284616 A1* | 10/2018 | Kawakami | G03F 7/11 |
| 2019/0035650 A1 | 1/2019 | Nakai et al. | |
| 2019/0196335 A1 | 6/2019 | Harumoto et al. | |

FOREIGN PATENT DOCUMENTS

| | | | |
|---|---|---|---|
| JP | 2004-022783 A | 1/2004 | |
| JP | 2007-019161 A | 1/2007 | |
| JP | 2009-194034 A | 8/2009 | |
| JP | 2015-023172 A | 2/2015 | |
| JP | 2016-219471 A | 12/2016 | |
| JP | 2017-098295 A | 6/2017 | |
| JP | 2018-046205 A | 3/2018 | |
| JP | 2019-029527 A | 2/2019 | |

* cited by examiner

SUBSTRATE PROCESSING APPARATUS, AND SUBSTRATE PROCESSING METHOD

CROSS REFERENCE TO RELATED APPLICATIONS

The present application claims priority under 35 U.S.C. § 119 to Japanese Patent Application No. 2018-196015, filed on Oct. 17, 2018. The contents of this application are incorporated herein by reference in their entirety.

TECHNICAL FIELD

The subject matter of the present application relates to a substrate processing apparatus, and a substrate processing method.

BACKGROUND

There is a known substrate processing apparatus configured to perform processing of substrates employed for electronic devices such as semiconductor devices and liquid crystal displays. Such a substrate processing is performed in manufacturing processes of electronic devices which include repeating processes such as film formation and etching on a substrate surface to form fine patterns thereon. Here, the substrate surface needs to be kept clean in order to successfully perform microfabrication on the substrate surface. This typically requires cleaning treatment of the substrate surface with a rinse liquid. This raises the need to remove the rinse liquid adhering to the substrate surface to dry the substrate after the end of the cleaning treatment.

One of important issues in the drying treatment is drying the substrate without collapsing the patterns formed on the substrate surface. Sublimation drying technology is attracting attention as a method for solving the issue. In the technology, a pattern is formed by feeding a developer solution to a photoresist film after exposure processing to dissolve the photoresist film applied to a substrate surface. The developer solution is then removed by feeding a rinse liquid to the substrate surface. At the end of rinsing, polymer soluble in the rinse liquid is fed to the substrate with the rinse liquid covering the substrate surface, and subsequently the substrate on which a polymer solution has been formed is dried. For example, recesses in the patterns (gaps between protrusions of photoresist film) are filled with polymer. The polymer is subsequently removed by selective plasma ashing.

SUMMARY

A substrate processing apparatus according to an aspect of the subject matter of the present application performs processing of a substrate having an upper side and a rear side. The substrate processing apparatus includes a substrate holder that rotates the substrate while holding a central portion of the rear side of the substrate, a filler feeder that feeds filler to the upper side of the substrate held by the substrate holder, and a first cleaning liquid feeder that feeds a cleaning liquid to the rear side of the substrate held by the substrate holder. The first cleaning liquid feeder feeds the cleaning liquid toward an area, held by the substrate holder, of the rear side of the substrate.

In the substrate processing apparatus according to an embodiment, the substrate holder allows the substrate holder to stick to (or adhere to) the central portion of the rear side of the substrate.

In the substrate processing apparatus according to an embodiment, when feeding the cleaning liquid toward the area, held by the substrate holder, of the rear side of the substrate, the first cleaning liquid feeder feeds the cleaning liquid such that the cleaning liquid is spread on the rear side of the substrate and approaches the area, held by the substrate holder, of the rear side of the substrate without coming into contact with the area.

In the substrate processing apparatus according to an embodiment, the first cleaning liquid feeder has at least one nozzle that ejects the cleaning liquid.

In the substrate processing apparatus according to an embodiment, the at least one nozzle is directed toward the substrate with a segment of a travelling direction projected on the rear side of the substrate being parallel to a perpendicular direction to a direction from a center of the substrate toward a reaching point. Here, the travelling direction is a travelling direction of the cleaning liquid just before the cleaning liquid reaches the reaching point on the rear side of the substrate.

In the substrate processing apparatus according to an embodiment, the substrate processing apparatus includes, as the at least one nozzle, a first nozzle and a second nozzle. Here, a distance from the center of the substrate toward a reaching point on the substrate to which the first nozzle ejects a cleaning liquid is different from a distance from the center of the substrate toward a reaching point on the substrate to which the second nozzle ejects a cleaning liquid.

In the substrate processing apparatus according to an embodiment, the cleaning liquid ejected from the first nozzle is different from the cleaning liquid ejected from the second nozzle.

In the substrate processing apparatus according to an embodiment, the substrate processing apparatus further includes a nozzle mover that moves the at least one nozzle in a horizontal direction.

In the substrate processing apparatus according to an embodiment, the substrate processing apparatus further includes a second cleaning liquid feeder that feeds a cleaning liquid for cleaning an edge of the substrate.

In the substrate processing apparatus according to an embodiment, a distance from the center of the substrate to a point on the substrate to which the cleaning liquid from the second cleaning liquid feeder is fed is longer than a distance from the center of the substrate to a point on the substrate to which the cleaning liquid from the first cleaning liquid feeder is fed.

In the substrate processing apparatus according to an embodiment, a component contained in the cleaning liquid is selected from the group consisting of isopropyl alcohol, propylene glycol monomethyl ether acetate, 1-ethoxy-2-propanol, and acetone.

In the substrate processing apparatus according to an embodiment, the substrate processing apparatus further includes an inert gas feeder that feeds an inert gas to the rear side of the substrate.

A substrate processing method according to another aspect of the subject matter of the present application is a method of performing processing of a substrate having an upper side and a rear side. The substrate processing method includes rotating the substrate while holding a central portion of the rear side of the substrate, feeding filler to the upper side of the substrate, and feeding a cleaning liquid to the rear side of the substrate after the feeding the filler. The feeding the cleaning liquid includes feeding the cleaning liquid toward an area held of the rear side of the substrate.

In the substrate processing method according to an embodiment, the feeding the cleaning liquid includes feeding the cleaning liquid to the rear side of the substrate such that the cleaning liquid is spread on the rear side of the substrate and approaches the area held of the rear side of the substrate without coming into contact with the area.

In the substrate processing method according to an embodiment, in the feeding the cleaning liquid, a segment of a travelling direction projected on the rear side of the substrate is parallel to a perpendicular direction to a direction from a center of the substrate toward a reaching point. Here, the travelling direction is a travelling direction of the cleaning liquid just before the cleaning liquid reaches the reaching point on the rear side of the substrate.

In the substrate processing method according to an embodiment, the feeding the filler includes ejecting the filler to the upper side of the substrate, rotating the substrate at a first rotational speed after the filler is ejected, rotating the substrate at a second rotational speed lower than the first rotational speed after the substrate is rotated at the first rotational speed, and rotating the substrate at a third rotational speed higher than the second rotational speed after the substrate is rotated at the second rotational speed.

In the substrate processing method according to an embodiment, the feeding the cleaning liquid includes feeding, by a first cleaning liquid feeder, the cleaning liquid toward the area held of the rear side of the substrate, feeding, by a second cleaning liquid feeder, a cleaning liquid for cleaning an edge of the substrate, rotating the substrate at a fourth rotational speed lower than the third rotational speed while the cleaning liquid from the first cleaning liquid feeder is being fed, and rotating the substrate at a fifth rotational speed higher than the fourth rotational speed while the cleaning liquid from the second cleaning liquid feeder is being fed.

The substrate processing method according to an embodiment further includes feeding an inert gas to the rear side of the substrate from a point in time before the filler is fed to a point in time when the feeding the cleaning liquid ends.

In the substrate processing method according to an embodiment, in the feeding the inert gas, a flow rate of the inert gas in the feeding the filler is lower than a flow rate of the inert gas in the feeding the cleaning liquid.

In the substrate processing method according to an embodiment, the feeding the cleaning liquid includes feeding the cleaning liquid toward the area held of the rear side of the substrate, and subsequently feeding a cleaning liquid to an edge of the substrate.

DETAILED DESCRIPTION

Figure 1:
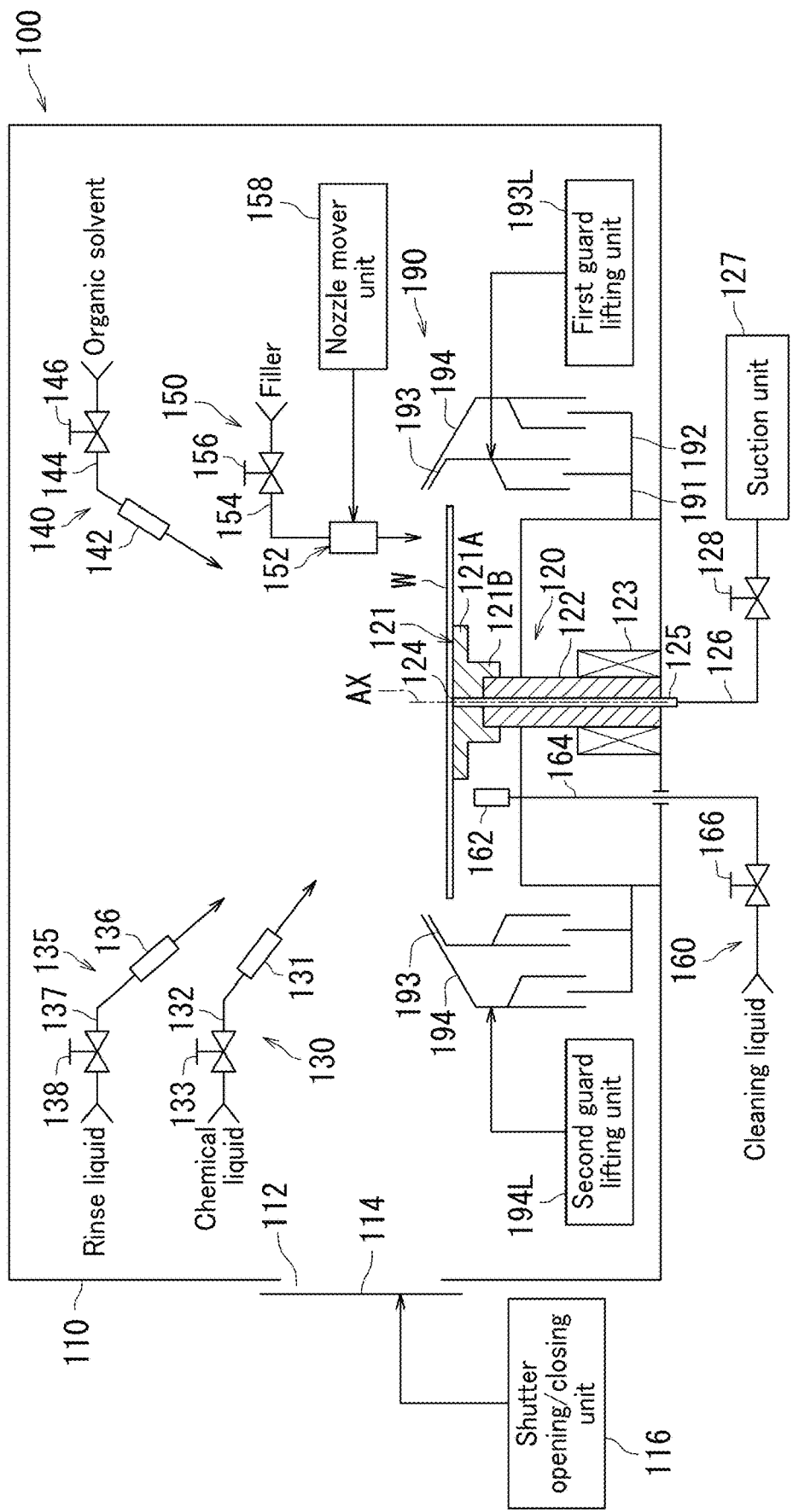
FIG. 1 is a schematic illustration of a substrate processing apparatus according to the present embodiment.

The present embodiment will hereinafter be described with reference to the accompanying drawings. Note that elements that are the same or equivalent are labelled with the same reference signs in the drawings and description thereof is not repeated.

An embodiment of a substrate processing apparatus 100 will be described with reference to FIG. 1. FIG. 1 is a schematic illustration of the substrate processing apparatus 100 according to the present embodiment.

The substrate processing apparatus 100 is presented for performing of a substrate W. Processing of the substrate W to be performed by the substrate processing apparatus 100 includes at least one of etching, surface treatment, characterizing, forming treatment membrane, removing at least part of the membrane, or cleaning.

Examples of the substrate W include a semiconductor wafer, a liquid crystal display substrate, a plasma display substrate, a field emission display (FED) substrate, an optical disk substrate, a magnetic substrate, a magneto-optical disk substrate, a photomask substrate, a ceramic substrate, and a solar cell substrate. For example, the substrate W has a disk shape. Here, the substrate processing apparatus 100 will perform processing of the substrate W one by one.

The substrate processing apparatus 100 includes a chamber 110, a substrate holder 120, a chemical liquid feeder 130, a rinse liquid feeder 135, an organic solvent feeder 140, a filler feeder 150, and a first cleaning liquid feeder 160. The chamber 110 houses the substrate W. The substrate holder 120 holds the substrate W. The chemical liquid feeder 130 feeds a chemical liquid to the substrate W. The rinse liquid feeder 135 feeds a rinse liquid to the substrate W. The organic solvent feeder 140 feeds an organic solvent to the substrate W. The filler feeder 150 feeds filler to the substrate W. The first cleaning liquid feeder 160 feeds a cleaning liquid to the substrate W.

The chamber 110 has a box shape with an internal space. The chamber 110 houses the substrate W. Here, the substrate processing apparatus 100 is classified as a single wafer type and performs processing of the substrate W one by one. The substrate W is accordingly housed in the chamber 110 one by one. The substrate W is housed in the chamber 110 to be processed therein. The chamber 110 houses at least part of each of the substrate holder 120, the chemical liquid feeder 130, the rinse liquid feeder 135, the organic solvent feeder 140, the filler feeder 150, and the first cleaning liquid feeder 160.

A side wall of the chamber 110 is provided with an entrance 112 that allows the substrate W to be loaded into and unloaded from the chamber 110 therethrough. The chamber 110 is provided with a shutter 114 that is opened and shut, thereby opening and shutting the entrance 112. A shutter opening/closing unit 116 opens and shuts the shutter 114.

The substrate holder 120 holds the substrate W. The substrate holder 120 holds the substrate W in a horizontal posture such that an upper side of the substrate W faces upward, and a rear side of the substrate W faces vertically downward. The substrate holder 120 rotates the substrate W while holding the substrate W.

For example, the substrate holder 120 may be a vacuum chuck. In this case, the substrate holder 120 holds the substrate W in the horizontal posture by causing a central portion of the rear side (lower side) of the substrate W to stick (adhere) to an upper surface of a spin base 121. Here, the rear side of the substrate W is a surface on which no device is formed.

The substrate holder 120 includes the spin base 121, a rotating shaft 122, and an electric motor 123. The rotating shaft 122 is a hollow shaft. The rotating shaft 122 is elongated in a vertical direction along an axis of rotation AX. The spin base 121 is joined to an upper end of the rotating shaft 122. The substrate W is placed on the spin base 121 in a state in which the rear side of the substrate W is in contact with the spin base 121.

The spin base 121 has a disk shape and holds the substrate W in the horizontal posture. The spin base 121 has a disk portion 121A, and a cylindrical portion 121B. The substrate W is placed on the disk portion 121A in a state in which the rear side of the substrate W is in contact with the disk portion 121A. The disk portion 121A has a disk shape and is kept in a horizontal position. The upper end of the rotating shaft 122 is fit into the cylindrical portion 121B. A diameter of an upper surface of the disk portion 121A is smaller than a diameter of the substrate W.

The rotating shaft 122 is elongated downward from a central portion of the spin base 121. The electric motor 123 provides torque to the rotating shaft 122. The electric motor 123 rotates the rotating shaft 122 in a rotational direction, thereby rotating the substrate W and the spin base 121 around the axis of rotation AX.

The substrate holder 120 further includes a suction unit 127. The suction unit 127 includes a vacuum pump. The suction unit 127 sucks up the substrate W placed on the upper surface of the spin base 121, and thereby the substrate W is held by the spin base 121. A suction route 125 is threaded through the spin base 121 and the rotating shaft 122. The suction route 125 has a suction port 124 exposed from a center of the upper surface of the spin base 121. The suction route 125 is coupled to a suction tube 126. A suction tube 126 is coupled to the suction unit 127. A valve 128 for opening and shutting the suction tube 126 is disposed in the suction tube 126.

As stated above, the substrate holder 120 may be the vacuum chuck. The substrate holder 120 is however not limited to the vacuum chuck. The substrate holder 120 may have a voluntary mechanism that holds the substrate W from the rear side. Alternatively, the substrate holder 120 may be combined with a clamping chuck that causes chuck pins to come into contact with the edge of the substrate W.

The chemical liquid feeder 130 feeds the chemical liquid to the upper side of the substrate W. The chemical liquid enables processing of the substrate W.

Examples of processing to be performed by the chemical liquid include etching, surface treatment, characterizing, forming treatment membrane, removing at least part of the membrane, cleaning, and at least one of them. Examples of the chemical liquid include hydrofluoric acid (HF). Examples of a liquid contained in the chemical liquid may include sulfuric acid, acetic acid, nitric acid, hydrochloric acid, citric acid, buffered hydrofluoric acid (BHF), dilute hydrofluoric acid (DHF), ammonia water, dilute ammonia water, hydrogen peroxide solution, organic alkali (examples thereof include tetramethylammonium hydroxide (TMAH)), surfactant, corrosion inhibitor, and at least one of them. The chemical liquid may also be a mixture obtained by mixing the above-described liquids. Examples of the mixture include a sulfuric acid-hydrogen peroxide mixture (SPM), ammonium hydrogen-peroxide mixture (SC1), and a hydrochloric acid hydrogen peroxide mixture (SC2).

The chemical liquid feeder 130 includes a nozzle 131, a feed pipe 132, and a valve 133. The nozzle 131 faces the upper side of the substrate W, and ejects the chemical liquid to the upper side of the substrate W. The feed pipe 132 is joined to the nozzle 131. The nozzle 131 is located at the tip of the feed pipe 132. The chemical liquid is fed into the feed pipe 132 from a chemical liquid feed source. The feed pipe 132 is provided with the valve 133. The valve 133 opens and shuts an opening in a passageway inside the feed pipe 132.

The rinse liquid feeder 135 feeds the rinse liquid to the upper side of the substrate W. The rinse liquid serves to wash away the chemical liquid adhering to the substrate W. Examples of the rinse liquid to be fed from the rinse liquid feeder 135 include deionized water (DIW), carbonated water, electrolytic ionized water, ozonated water, ammonia water, diluted hydrochloric acid water (of which dilution concentration is, for example about 10 ppm to 100 ppm), and reduced water (hydrogen water).

The rinse liquid feeder 135 includes a nozzle 136, a feed pipe 137, and a valve 138. The nozzle 136 faces the upper side of the substrate W, and ejects the rinse liquid to the upper side of the substrate W. The feed pipe 137 is joined to the nozzle 136. The nozzle 136 is located at the tip of the feed pipe 137. The rinse liquid is fed into the feed pipe 137 from a feed source. The feed pipe 137 is provided with the valve 138. The valve 138 opens and shuts an opening in a passageway inside the feed pipe 137.

The organic solvent feeder 140 feeds the organic solvent to the upper side of the substrate W. For example, it is preferable that the organic solvent allow a solvent contained in the filler and water contained in the rinse liquid to be mixed therewith. The organic solvent may be isopropyl alcohol (IPA). Examples of the organic solvent may further include ethanol, acetone, propylene glycol ethyl ether (PGEE), and propyleneglycol monomethyl ether acetate (PGMEA).

The organic solvent feeder 140 includes a nozzle 142, a feed pipe 144, and a valve 146. The nozzle 142 faces the upper side of the substrate W, and ejects the chemical liquid to the upper side of the substrate W. The feed pipe 144 is joined to the nozzle 142. The nozzle 142 is located at the tip of the feed pipe 144. The organic solvent is fed into the feed pipe 144 from a feed source. The feed pipe 144 is provided with the valve 146. The valve 146 opens and shuts an opening in a passageway inside the feed pipe 144.

The filler feeder 150 feeds the filler to the upper side of the substrate W. The filler is fed thereon, and thereby a filling film is formed on the substrate W. In the case where fine patterns are formed on the substrate W, the filler is filled in gaps between the fine patterns to form the film. The filler feeder 150 feeding the filler makes it possible to prevent the fine patterns of the substrate W from easily being collapsed while, after cleaning by the rinse liquid with high surface tension, the substrate W to which the rinse liquid has been fed is dried. Note that the filling film may be formed not only in the gaps between the fine patterns but also on the fine patterns like a bridge.

For example, the filling film formed of the filler is preferably allowed to sublimate (sublimable). The filler is, for example a solution obtained by dissolving sublimable acrylate polymer in an organic solvent. Examples of the organic solvent in which the sublimable acrylate polymer is dissolved include PGEE. Examples of the organic solvent may further include IPA, and PGMEA.

The filler feeder 150 includes a nozzle 152, a feed pipe 154, and a valve 156. The nozzle 152 faces the upper side of the substrate W, and ejects the filler to the upper side of the substrate W. The feed pipe 154 is joined to the nozzle 152. The nozzle 152 is located on the tip of the feed pipe 154. The filler is fed into the feed pipe 154 from a feed source. The feed pipe 154 is provided with the valve 156. The valve 156 opens and shuts an opening in a passageway inside the feed pipe 154.

The first cleaning liquid feeder 160 feeds the cleaning liquid to the rear side of the substrate W. The first cleaning liquid feeder 160 feeds the cleaning liquid to the central area, outside the central portion held by the substrate holder 120, of the rear side of the substrate W. Hereinafter, the central area outside the central portion held by the substrate holder 120 is simply referred to as a "central area". In the present specification, the first cleaning liquid feeder 160 may simply be referred to as a cleaning liquid feeder 160.

The cleaning liquid feeder 160 may feed an organic solvent as the cleaning liquid. Preferable examples of the organic solvent include IPA, PGMEA, PGEE, ethanol, acetone, and at least one of them. Alternatively, the cleaning liquid feeder 160 may feed water as the cleaning liquid.

The cleaning liquid feeder 160 includes a nozzle 162, a feed pipe 164, and a valve 166. The nozzle 162 faces the upper side of the substrate W, and ejects the cleaning liquid to the rear side of the substrate W. The feed pipe 164 is joined to the nozzle 162. The nozzle 162 is located at the tip of the feed pipe 164. The cleaning liquid is fed into the feed pipe 164 from a feed source. The feed pipe 164 is provided with the valve 166. The valve 166 opens and shuts an opening in a passageway inside the feed pipe 164.

In the substrate processing apparatus 100, the filler feeder 150 feeding the filler to the upper side of the substrate W makes it possible to prevent the fine patterns from easily being collapsed while the substrate W to which the rinse liquid has been ejected is dried. However, when the filler is fed to the substrate, part of the filler may adhere to the rear side of the substrate.

Figure 2:
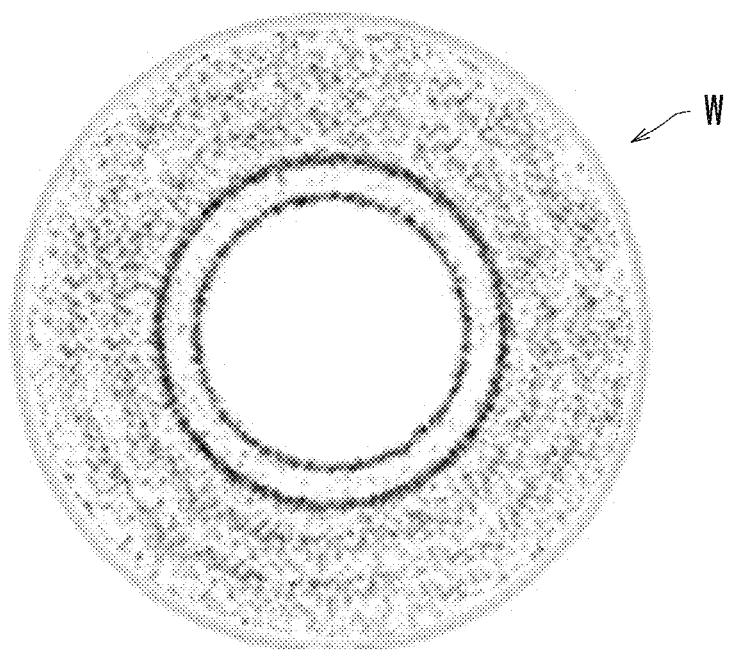
FIG. 2 illustrates a substrate in which filler adheres to a rear side of the substrate.

FIG. 2 is a schematic illustration of the rear side of the substrate W, to which the filler adheres. As illustrated in FIG. 2, in the case where the filler is fed to the substrate W and a filler layer is formed thereon, the filler may adhere to the rear side of the substrate W regardless of the substrate W being processed by plasma ashing. In the case where the substrate is exposed to light in a next photolithography process, the filler adhering to the rear side of the substrate W may interfere with proper focus of light because the surface height of the substrate W is out of a specified height. This case makes it difficult to appropriately form an exposure pattern, thereby decreasing product yield.

As illustrated in FIG. 1, the substrate processing apparatus 100 according to the present embodiment causes the cleaning liquid feeder 160 to feed the cleaning liquid to the rear side of the substrate W. Specifically, the cleaning liquid feeder 160 feeds the cleaning liquid toward an area, held by the substrate holder 120, of the rear side of the substrate W. This configuration enables the substrate processing apparatus 100 according to the present embodiment to prevent the filler from easily adhering to the rear side of the substrate W.

Note that heating the substrate W with the filler adhering to the rear side of the substrate W may make it difficult to remove the filler as a result of progress in polymerization of the filler. It is therefore preferable that the filler adhering to the rear side of the substrate W be removed before the substrate W is heated.

Figure 3A:
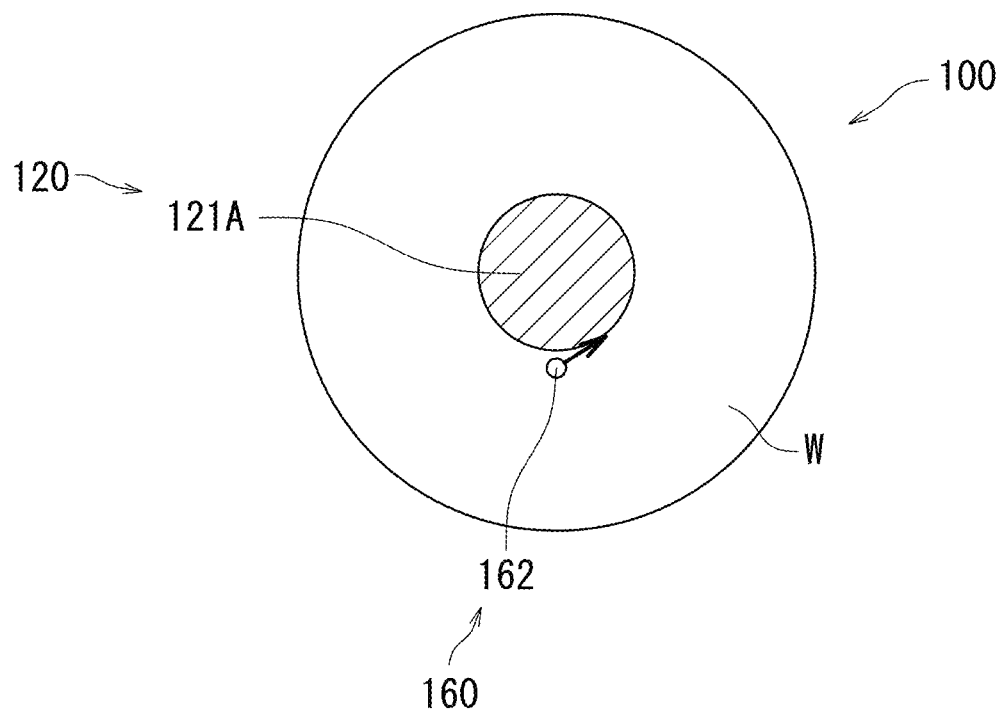
FIGS. 3A and 3B are schematic illustrations depicting a location of a cleaning liquid feeder relative to the substrate, in the substrate processing apparatus according to the present embodiment.
Figure 3B:
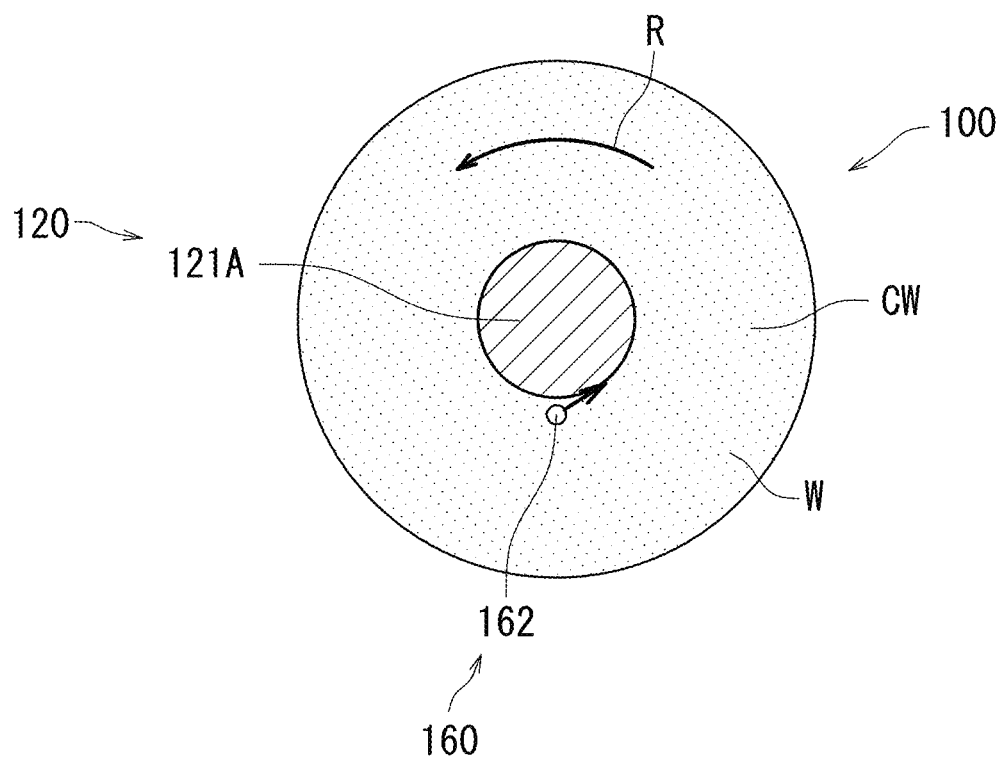

A positional relationship of the cleaning liquid feeder 160 with the substrate holder 120, and the substrate W, in the substrate processing apparatus 100 according to the present embodiment will be described with reference to FIGS. 3A and 3B. Each of FIGS. 3A and 3B is a schematic top view of the substrate W, the substrate holder 120, and the cleaning liquid feeder 160 in the substrate processing apparatus 100 according to the present embodiment. In FIGS. 3A and 3B, components other than the substrate W, the disk portion 121A of the substrate holder 120, and the nozzle 162 of the cleaning liquid feeder 160 are omitted in order to avoid an excessively complicated description.

As illustrated in FIGS. 1 and 3A, the spin base 121 of the substrate holder 120 has the disk portion 121A, and the substrate W is placed on the disk portion 121A with a center of the substrate W matching a center of the disk portion 121A. The nozzle 162 of the cleaning liquid feeder 160 is disposed outside the disk portion 121A in a radial direction of the substrate W. The nozzle 162 of the cleaning liquid feeder 160 is directed in a direction depicted by the arrow in FIG. 3A. In FIG. 3A, the arrow from the nozzle 162 is directed to a boundary of the disk portion 121A of the substrate holder 120. This enables the nozzle 162 of the cleaning liquid feeder 160 to eject the cleaning liquid in the direction depicted by the arrow in FIG. 3A.

As illustrated in FIG. 3B, the substrate holder 120 rotates the substrate W in a rotational direction R while holding the substrate W. The cleaning liquid feeder 160 feeds, from the nozzle 162, the cleaning liquid to the rear side of the substrate W with the substrate holder 120 holding and rotating the substrate W. In this case, the cleaning liquid feeder 160 feeds the cleaning liquid toward the area, held by the substrate holder 120, of the rear side of the substrate W. The cleaning liquid CW fed to the rear side of the substrate W not only reaches the vicinity of the substrate holder 120 in the substrate W but also spreads on the rear side of the substrate by centrifugal force. When the cleaning liquid feeder 160 continues to feed the cleaning liquid CW, the cleaning liquid CW spreads over the entire rear side of the substrate W except the central portion of the substrate W.

A process in which the cleaning liquid CW spreads on the rear side of the substrate W in the substrate processing apparatus 100 according to the present embodiment will next be described with reference to FIGS. 4A to 4D. Each of FIGS. 4A to 4D is a schematically top view illustrating a positional relationship between the substrate holder 120, the cleaning liquid CW, and the substrate W in the substrate processing apparatus 100 according to the present embodiment. Note that each of FIGS. 4A to 4D depicts an enlarged view in the vicinity of the disk portion 121A of the substrate holder 120.

Figure 4A:
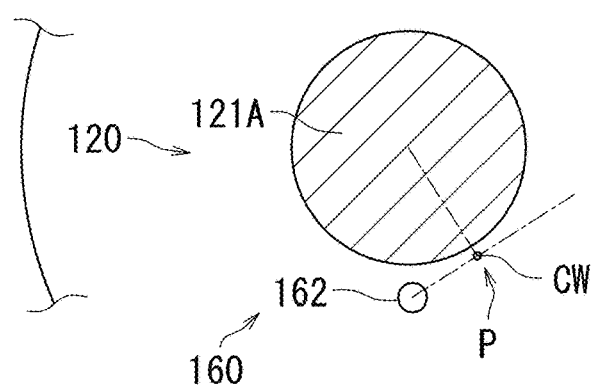
FIGS. 4A to 4D are schematic illustrations depicting the spreading process of a cleaning liquid fed to the substrate from the cleaning liquid feeder, in the substrate processing apparatus according to the present embodiment.
Figure 4A:
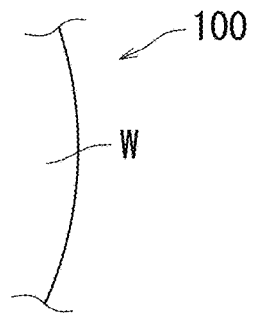

As illustrated in FIG. 4A, when feeding the cleaning liquid CW is started with the substrate W rotating, the cleaning liquid CW reaches the rear side of the substrate W. Note that when the cleaning liquid feeder 160 starts feeding (ejecting) the cleaning liquid CW from the nozzle 162, the cleaning liquid CW ejected from the nozzle 162 reaches a point P on the rear side of the substrate W. In the description below, the point P on the rear side of the substrate W, which the cleaning liquid CW ejected from the nozzle 162 reaches may also be referred to as a reaching point P.

In the substrate processing apparatus 100 according to the present embodiment, the nozzle 162 of the cleaning liquid feeder 160 is directed in a direction as a tangent direction of the rotational direction of the substrate W. Note that the nozzle 162 of the cleaning liquid feeder 160 is preferably directed toward the substrate W with a segment of a travelling direction projected on the rear side of the substrate W being parallel to a perpendicular direction to a direction from the center of the substrate W toward the reaching point P. Here, the travelling direction is a travelling direction of the cleaning liquid CW just before the cleaning liquid CW reaches the reaching point P on the rear side of the substrate W.

Figure 4B:
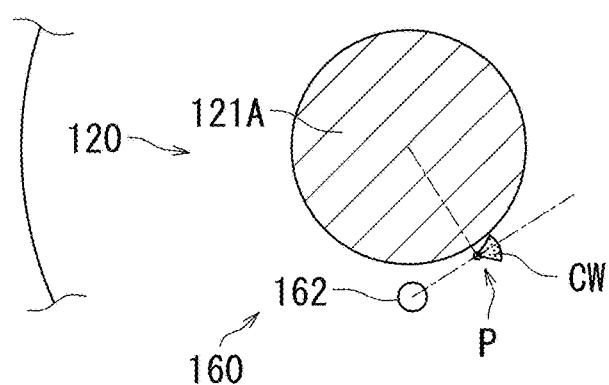
Figure 4B:
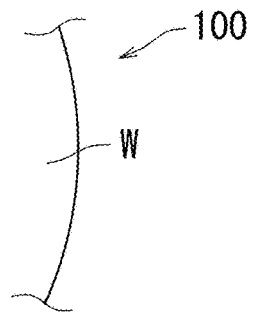

As illustrated in FIG. 4B, when the cleaning liquid CW is then further fed with the substrate W rotating, the cleaning liquid CW spreads from the reaching point P on the substrate W. At this moment, the cleaning liquid CW spreads on the rear side of the substrate W in both a direction in which the cleaning liquid CW is ejected from the nozzle 162 of the cleaning liquid feeder 160, and a radial direction of the substrate W in which the cleaning liquid CW receives centrifugal force by rotation of the substrate W. Thus, the central direction of spread of the cleaning liquid CW is slightly inclined in the radial direction from the center of the substrate W toward the reaching point P relative to a direction of the segment of the travelling direction, projected on the substrate W, of the cleaning liquid CW just before reaching the substrate W.

Figure 4C:
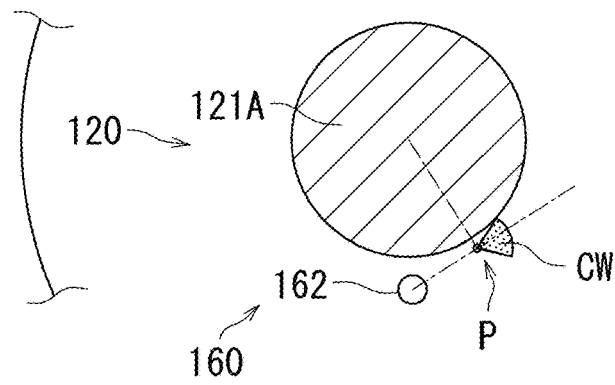
Figure 4C:
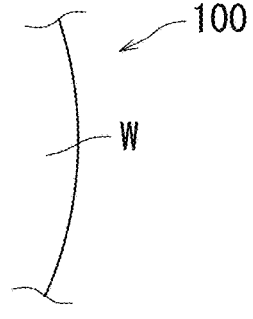

As illustrated in FIG. 4C, when the cleaning liquid CW is further fed with the substrate W rotating, the cleaning liquid CW further spreads from the reaching point P on the substrate W. The component (part) of the cleaning liquid CW in a reverse radial direction from the reaching point P toward the center of the substrate W approaches the area, held by the substrate holder 120, of the rear side of the substrate W. Specifically, the central portion of the rear side of the substrate W is in contact with the disk portion 121A of the spin base 121 in the substrate holder 120, and therefore the cleaning liquid CW approaches a boundary between the substrate W and the disk portion 121A. In contrast, the component of the cleaning liquid CW in the radial direction of the substrate W from the center of the substrate W toward the reaching point P spreads in both the direction of the segment of the travelling direction, projected on the substrate W, of the cleaning liquid CW from the nozzle 162 just before reaching the substrate W (reaching point P), and the radial direction of the substrate W in which the cleaning liquid CW receives centrifugal force by the rotation of the substrate W.

Figure 4D:
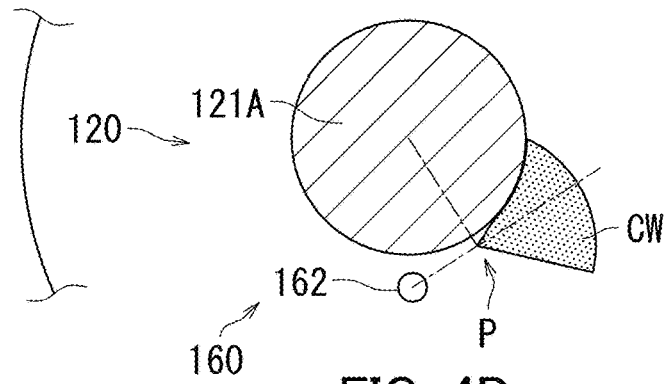
Figure 4D:
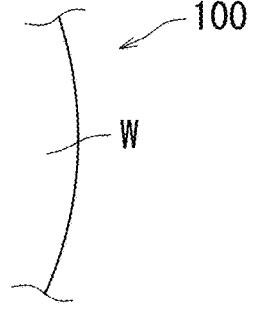

As illustrated in FIG. 4D, when the cleaning liquid CW is further fed with the substrate W rotating, the cleaning liquid CW further spreads from the reaching point P on the substrate W. The component of the cleaning liquid CW in the reverse radial direction of the substrate W from the reaching point P toward the center of the substrate W further approaches the area, held by the substrate holder 120, of the rear side of the substrate W. Here, the component is in the vicinity of the area held by the substrate holder 120 without reaching the substrate holder 120, and in this state rotates according to the rotation of the substrate W. Note that the distance between the cleaning liquid CW (reaching point P) and the substrate holder 120 is preferably 3 mm or less, and more preferably 1 mm or less. Specifically, the central portion of the rear side of the substrate W is in the contact with the disk portion 121A of the spin base 121 in the substrate holder 120, and therefore the state in which the cleaning liquid CW is in the vicinity of the boundary between the substrate W and the disk portion 121A without reaching the substrate holder 120 progresses. In contrast, the component of the cleaning liquid CW in the radial direction from the center of the substrate W toward the reaching point P spreads in both the direction of the segment of the travelling direction, projected on the substrate W, of the cleaning liquid CW from the nozzle 162 just before reaching the substrate W (reaching point P), and the radial direction of the substrate W in which the cleaning liquid CW receives centrifugal force by the rotation of the substrate W.

When the cleaning liquid CW is then further fed with the substrate W rotating, the cleaning liquid CW further spreads from the reaching point P on the substrate W. Although illustration is omitted here, the component of the cleaning liquid CW in the reverse radial direction of the substrate W from the reaching point P toward the center of the substrate W is in the vicinity of the area held by the substrate holder 120, and in this state rotates once according to rotation of the substrate W. Specifically, the central portion of the rear side of the substrate W is in contact with the disk portion 121A of the spin base 121 in the substrate holder 120, and therefore the cleaning liquid CW is in the vicinity of the boundary between the substrate W and the disk portion 121A, and in this state rotates once. In contrast, the component of the cleaning liquid CW in the radial direction of the substrate W from the center of the substrate W toward the reaching point P spreads in the direction of the segment of the travelling direction, projected on the substrate W, of the cleaning liquid CW from the nozzle 162 just before reaching the substrate W (reaching point P), and then reaches the edge of the substrate W, thereby spreading over the entire rear side of the substrate W.

In the substrate processing apparatus 100 according to the present embodiment, the cleaning liquid feeder 160 feeding the cleaning liquid CW enables spreading of the cleaning liquid CW almost all over the area, not held by the substrate holder 120, of the rear side of the substrate W. It is therefore possible to clean, by the cleaning liquid CW of the cleaning liquid feeder 160, the substrate W in which filler adheres to the rear side of the substrate W as a result of the filler feeder 150 feeding the filler to the substrate W.

Note that preferably in FIG. 4A the distance between the reaching point P and the substrate holder 120 is determined based on spread of the cleaning liquid CW. Examples of the distance between the reaching point P and the substrate holder 120 may include not less than 0.5 mm and not greater than 5.0 mm, and not less than 0.8 mm and not greater than 4.0 mm.

Note that in the above description with reference to FIGS. 3A, 3B and 4A to 4D, the segment of the travelling direction, projected on the substrate W, of the cleaning liquid CW just before reaching the substrate W (reaching point P) is almost parallel to the perpendicular direction to the direction from the center of the substrate W toward the reaching point P, but the present embodiment is not limited to this. In the description below of the present specification, the direction of the segment of the travelling direction, projected on the substrate W, of the cleaning liquid CW from the nozzle 162 just before reaching the substrate W may be described as an "incident direction of the cleaning liquid CW". The incident direction of the cleaning liquid CW need not be parallel to the perpendicular direction to the direction from the center of the substrate W toward the reaching point P. The incident direction of the cleaning liquid CW varies according to an ejection distance of the cleaning liquid CW even if the location of the nozzle 162 is unchanged.

Figure 5:
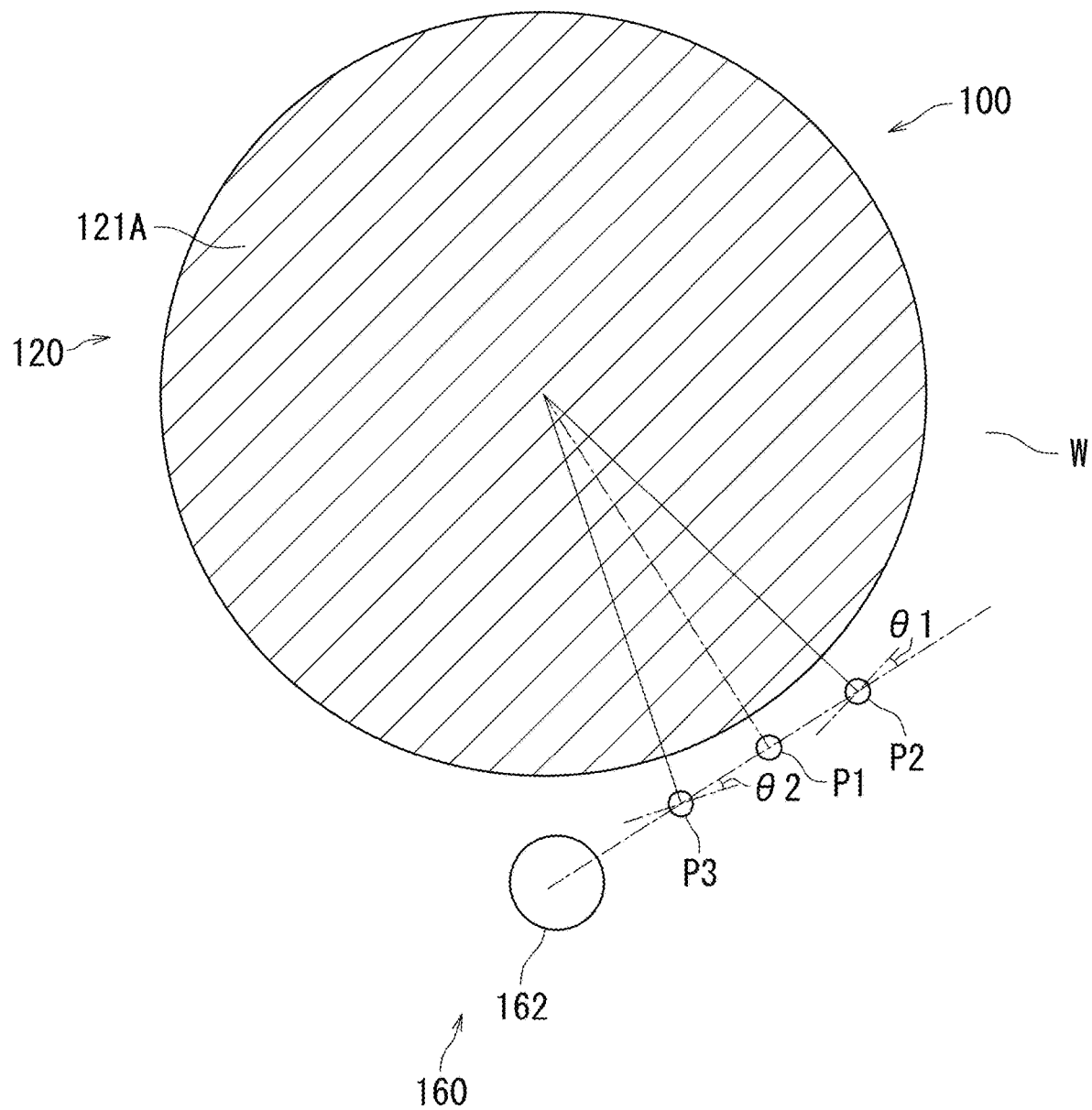
FIG. 5 is a schematic illustration depicting a reaching point of the cleaning liquid fed to the substrate from the cleaning liquid feeder, in the substrate processing apparatus according to the present embodiment.

A relationship between the incident direction of the cleaning liquid CW and the perpendicular direction to the direction from the center of the substrate W toward the reaching point P will next be described with reference to FIG. 5. FIG. 5 is a schematic illustration depicting the reaching point of the cleaning liquid fed to the substrate W from the cleaning liquid feeder 160 in the substrate processing apparatus 100 according to the present embodiment.

When the cleaning liquid ejected from the nozzle 162 of the cleaning liquid feeder 160 reaches a reaching point P1 on the substrate W, the incident direction of the cleaning liquid CW is parallel to a direction to a perpendicular direction from the center of the substrate W toward the reaching point P1. The incident direction of the cleaning liquid CW being parallel to the perpendicular direction to the direction from the center of the substrate W toward the reaching point P1 is however not indispensable.

For example, the incident direction of the cleaning liquid CW may be slightly inclined in a radial direction from the center of the substrate W toward a reaching point relative to a perpendicular direction to the radial direction. For example, when a cleaning liquid CW ejected from the nozzle 162 of the cleaning liquid feeder 160 reaches a reaching point P2 on the substrate W, the incident direction of the cleaning liquid CW is directed in a direction that is slightly inclined in a radial direction from the center of the substrate W toward the reaching point P2 relative to a perpendicular direction to the radial direction. In this case, the spread of the cleaning liquid CW in the reverse radial direction of the substrate W from the reaching point P2 toward the center of the substrate W may be insufficient because the cleaning liquid CW receives the centrifugal force in the radial direction from the center of the substrate W toward the reaching point P2. It is therefore preferable that an angle θ1 between the incident direction of the cleaning liquid CW and the perpendicular direction to the radial direction from the center of the substrate W toward the reaching point P2 not be too large. Preferable examples of the angle θ1 include not greater than 30°.

Alternatively, the incident direction of the cleaning liquid CW may be directed in a direction that is slightly inclined in a reverse radial direction from a reaching point toward the center of the substrate W relative to a perpendicular direction to a direction (radial direction) from the center of the substrate W toward the reaching point. For example, when a cleaning liquid ejected from the nozzle 162 of the cleaning liquid feeder 160 reaches a reaching point P3 on the substrate W, the incident direction of the cleaning liquid CW is directed in a direction that is slightly inclined in a reverse radial direction from the reaching point P3 toward the center of the substrate W relative to a perpendicular direction to a direction (radial direction) from the center of the substrate W toward the reaching point P3. In this case, the spread of the cleaning liquid CW in the radial direction of the substrate W from the center of the substrate W to the reaching point P3 may be insufficient because the component of the cleaning liquid CW in the incident direction (reverse radial direction) is the component in a direction against the centrifugal force in the radial direction. Also, in the case where the incident direction of the cleaning liquid CW is directed in the direction that is slightly inclined in the reverse radial direction relative to the perpendicular direction to the direction from the center of the substrate W toward the reaching point P1, the cleaning liquid CW reaching the boundary between the substrate holder 120 and the substrate W may cause a reduction in a substrate holding function by the substrate holder 120 because the cleaning liquid CW may permeate inside the substrate holder 120 through a gap between the substrate holder 120 and the substrate W. It is therefore preferable that an angle θ2 between the incident direction of the cleaning liquid CW and the perpendicular direction to the direction from the center of the substrate W toward the reaching point P3 not be too large. Preferable examples of the angle θ2 include not greater than 20°.

Note that the incident direction of the cleaning liquid CW being almost parallel to the perpendicular direction to the direction from the center of the substrate W toward the reaching point facilitates adjustment of the ejection direction of the nozzle 162, and the incident direction and the ejection distance of the cleaning liquid CW. The incident direction of the cleaning liquid CW may therefore be almost parallel to the perpendicular direction to the direction from the center of the substrate W toward the reaching point.

Note that in the description with reference to FIGS. 1, and 3A to 5, the cleaning liquid feeder 160 ejects, from one nozzle thereof, a cleaning liquid to a substrate W to be processed, but the present embodiment is not limited to this. The cleaning liquid feeder 160 may have nozzles and eject a cleaning liquid to the substrate W from each of the nozzles.

In the description with reference to FIGS. 3A and 3B, the cleaning liquid feeder 160 ejects, from one nozzle thereof, a cleaning liquid to a substrate W to be processed, but the present embodiment is not limited to this. The cleaning liquid feeder 160 may have nozzles and eject different cleaning liquids to the substrate W from the nozzles.

Figure 6A:
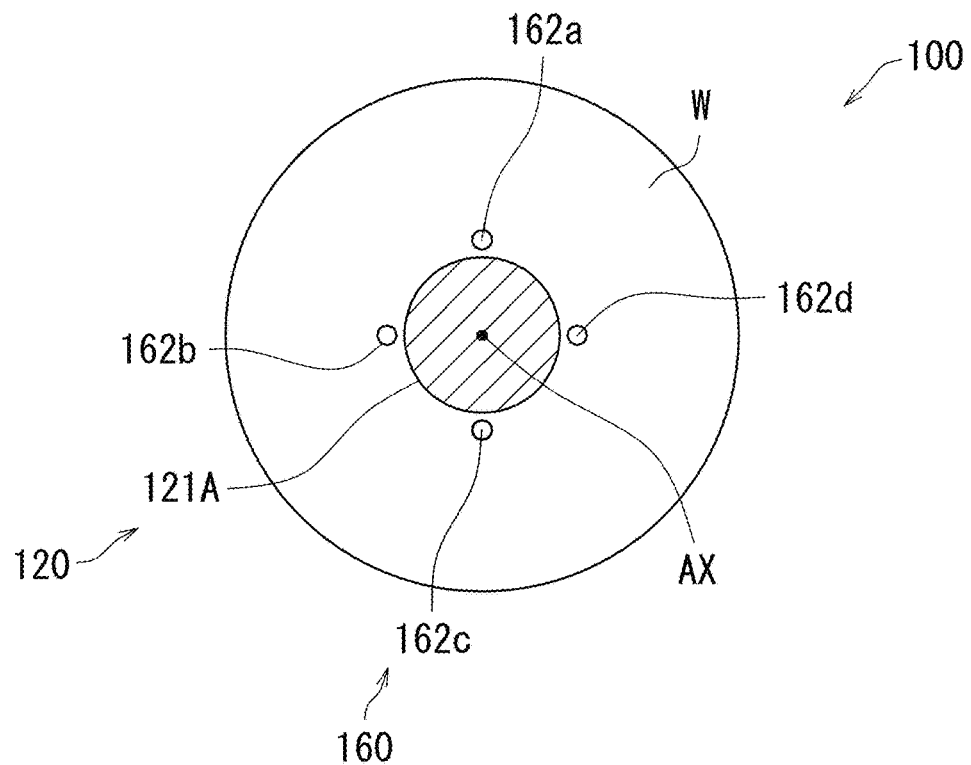
FIGS. 6A and 6B are schematic illustrations depicting a substrate processing apparatus according to the present embodiment.

Here, a cleaning liquid feeder 160 in a substrate processing apparatus 100 according to the present embodiment will be described with reference to FIGS. 6A and 6B. FIG. 6A is a schematic top view of the substrate processing apparatus 100 according to the present embodiment. As illustrated in FIG. 6A, the cleaning liquid feeder 160 has, as nozzles 162, nozzles 162a, 162b, 162c, and 162d.

The nozzles 162a, 162b, 162c, and 162d are disposed at regular intervals around an axis of rotation AX of the substrate holder 120. Respective distances from the nozzles 162a, 162b, 162c, and 162d to the axis of rotation AX are almost the same as each other. The nozzles 162a and 162c are disposed opposite to each other, while the nozzles 162b and 162d are disposed opposite to each other.

Figure 6B:
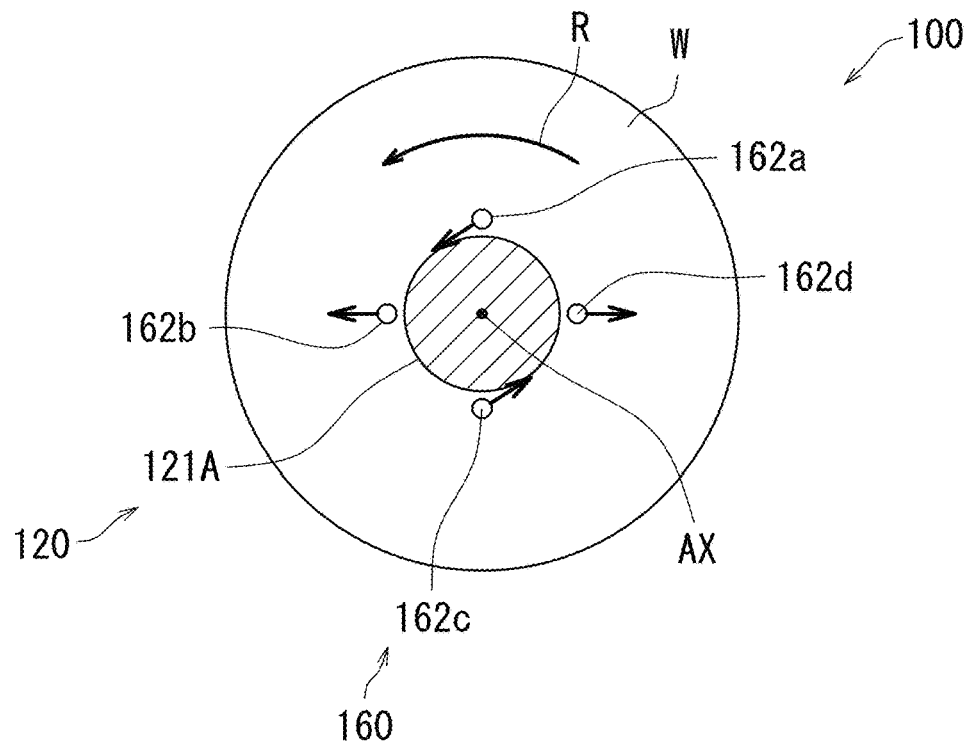

FIG. 6B is a schematic top view of the substrate processing apparatus 100 according to the present embodiment. As illustrated in FIG. 6B, each of the nozzles 162a and 162c ejects a cleaning liquid in the rotational direction R of the substrate W. Each of the nozzles 162b and 162d ejects a cleaning liquid in a radial direction of the substrate W. Respective distances from the center of the substrate W to respective reaching points on the substrate W of the cleaning liquids ejected from the nozzles 162a and 162c are therefore different from respective distances from the center of the substrate W to respective reaching points on the substrate W of the cleaning liquids ejected from the nozzles 162b and 162d. The respective distances from the center of the substrate W to the respective reaching points on the substrate W of the cleaning liquids ejected from the nozzles 162a and 162c are comparative short, whereas the respective distances from the center of the substrate W to the respective reaching points on the substrate W of the cleaning liquids ejected from the nozzles 162b and 162d are comparative long.

Note that the cleaning liquids to be ejected from the nozzles 162a and 162c may be different from the cleaning liquids to be ejected from the nozzles 162b and 162d. For example, each of the nozzles 162a and 162c may eject IPA as the cleaning liquid thereof, and each of the nozzles 162b and 162d may eject DIW as the cleaning liquid thereof. In this case, the nozzles 162a and 162c may be joined to a common feed pipe, and the nozzles 162b and 162d may be joined to a common feed pipe different from that of the nozzles 162a and 162c.

Note that in the above description with reference to FIGS. 1, and 3A to 6B, the cleaning liquid feeder 160 of each substrate processing apparatus 100 feeds a cleaning liquid to the central area of the rear side of a substrate W to be processed, thereby cleaning the whole rear side of the substrate W other than the central portion thereof, but the present embodiment is not limited to this. The substrate processing apparatus 100 may have a feeder, different from the cleaning liquid feeder 160, which feeds a cleaning liquid suitable for cleaning of the rear side, an edge, and a periphery of the upper side of the substrate W.

Figure 7:
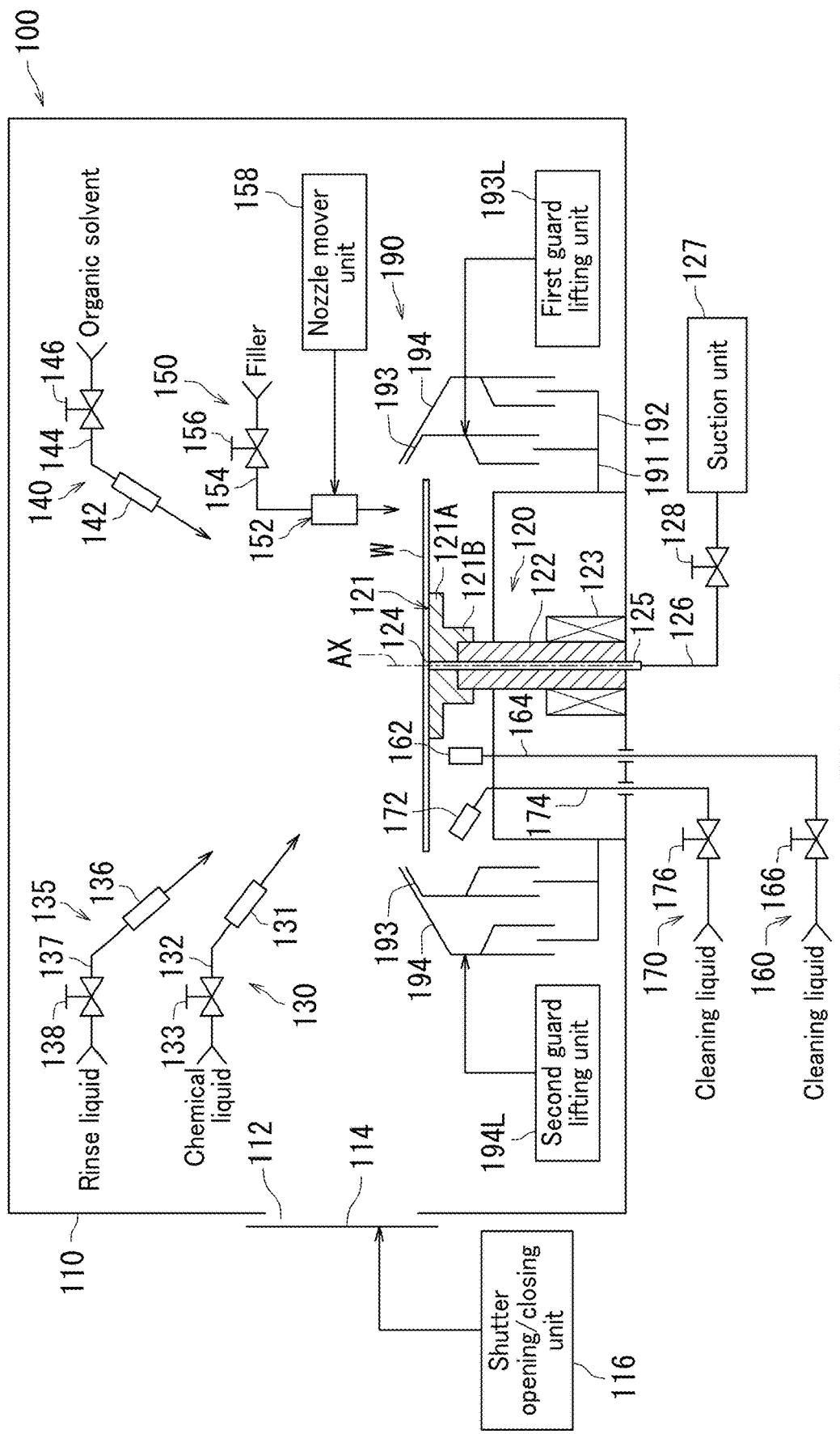
FIG. 7 is a schematic illustration depicting a substrate processing apparatus according to the present embodiment.

A substrate processing apparatus 100 further including a second cleaning liquid feeder 170 that feeds a cleaning liquid to a rear side of a substrate W will next be described with reference to FIG. 7. FIG. 7 is a schematic illustration of the substrate processing apparatus 100 according to the present embodiment. The substrate processing apparatus 100 illustrated in FIG. 7 further includes the second cleaning liquid feeder 170 that feeds the cleaning liquid to the rear side of the substrate W, and has a configuration that is similar to that of the substrate processing apparatus 100 as explained above with reference to FIG. 1, except the second cleaning liquid feeder 170. Duplicate descriptions are therefore omitted for the purpose of avoiding redundancy.

The substrate processing apparatus 100 according to the present embodiment includes the second cleaning liquid feeder 170 in addition to a chamber 110, a substrate holder 120, a chemical liquid feeder 130, a rinse liquid feeder 135, an organic solvent feeder 140, a filler feeder 150, and a first cleaning liquid feeder 160. The second cleaning liquid feeder 170 feeds the cleaning liquid to the rear side of substrate W.

The second cleaning liquid feeder 170 feeds a cleaning liquid thereof to an area of the rear side of the substrate W, which is, in a radial direction, outside an area to which a cleaning liquid from the first cleaning liquid feeder 160 is fed. The cleaning liquid fed from the second cleaning liquid feeder 170 sufficiently reaches an edge of the substrate W, and cleans the rear side, the edge, and a periphery of an upper side of the substrate W. Note that in the present specification, the second cleaning liquid feeder 170 may simply be referred to as a cleaning liquid feeder 170.

The second cleaning liquid feeder 170 includes a nozzle 172, a feed pipe 174, and a valve 176. The nozzle 172 faces the rear side of the substrate W, and ejects the cleaning liquid to the rear side of the substrate W. The feed pipe 174 is joined to the nozzle 172. The nozzle 172 is located at the tip of the feed pipe 174. The cleaning liquid is fed into the feed pipe 174 from a feed source. The feed pipe 174 is provided with the valve 176. The valve 176 opens and shuts an opening in a passageway inside the feed pipe 174.

Note that in the description with reference to FIG. 7, the cleaning liquid feeder 170 ejects the cleaning liquid to the substrate W from one nozzle thereof, but the present embodiment is not limited to this. The cleaning liquid feeder 170 may have nozzles, and ejects respective cleaning liquids to the substrate W from the nozzles.

Figure 8:
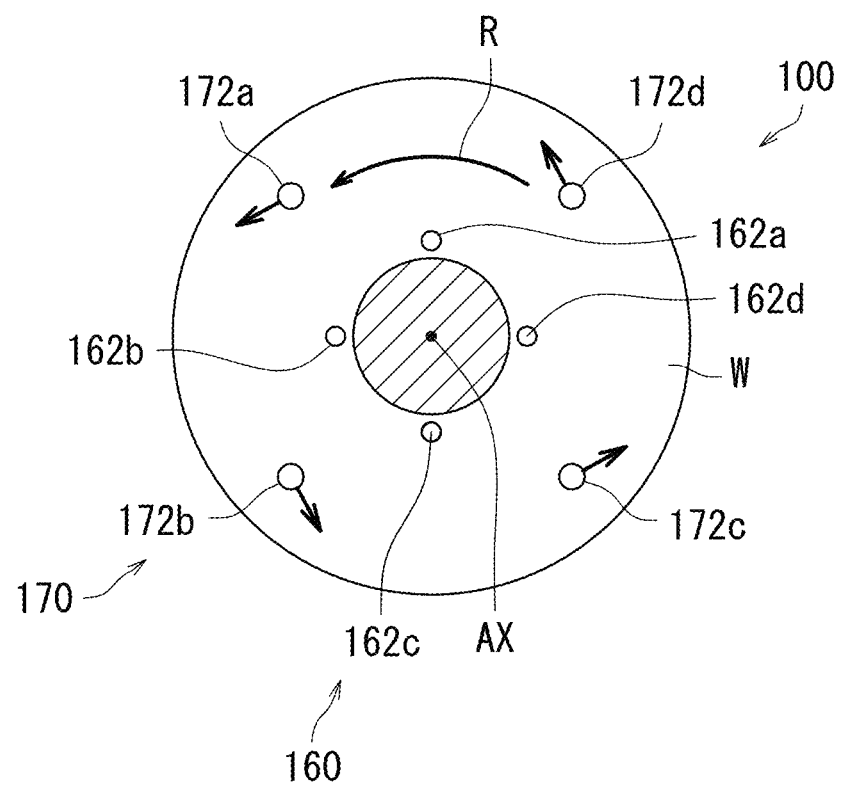
FIG. 8 is a schematic illustration depicting a substrate processing apparatus according to the present embodiment.

FIG. 8 is a schematic top view of a substrate processing apparatus 100 according to the present embodiment. In the substrate processing apparatus 100, a first cleaning liquid feeder 160 has nozzles 162a, 162b, 162c, and 162d. A second cleaning liquid feeder 170 has nozzles 172a, 172b, 172c, and 172d.

The nozzles 172a, 172b, 172c, and 172d are disposed at regular intervals around an axis of rotation of a substrate holder 120. Note that respective distances from the nozzles 172a, 172b, 172c, and 172d to the axis of rotation AX are almost the same as each other. The respective distances from the nozzles 172a, 172b, 172c, and 172d to the axis of rotation AX are longer than respective distances from the nozzles 162a, 162b, 162c, and 162d to the axis of rotation AX.

The nozzles 172a and 172c are disposed opposite to each other, while the nozzles 172b and 172d are disposed opposite to each other. Here, each of the nozzles 172a, 172b, 172c, and 172d ejects the cleaning liquid thereof in a direction that is slightly inclined in a radial direction relative to a rotational direction of the substrate W. Specifically, an ejection direction of the cleaning liquid from each of the nozzles 172a, 172b, 172c, and 172d is represented by a sum of a segment of the rotational direction of the substrate W, and a segment of the radial direction of the substrate W. The distance from a center of the substrate W toward a reaching point on the substrate W of each cleaning liquid fed from the second cleaning liquid feeder 170 is longer than the distance from the center of the substrate W toward a reaching point on the substrate W of each cleaning liquid fed from the first cleaning liquid feeder 160. For example, each of the nozzles 172a, 172b, 172c, and 172d may eject IPA as the cleaning liquid thereof. Alternatively, each of the nozzles 172a, 172b, 172c, and 172d may eject DIW as the cleaning liquid thereof.

Note that the cleaning liquid to be fed from each second cleaning liquid feeder 170 illustrated in FIGS. 7 and 8 may be different in at least part from the cleaning liquid to be fed from each first cleaning liquid feeder 160. The cleaning liquid to be fed from each second cleaning liquid feeder 170 may however be the same as the cleaning liquid to be fed from each first cleaning liquid feeder 160.

Figure 9A:
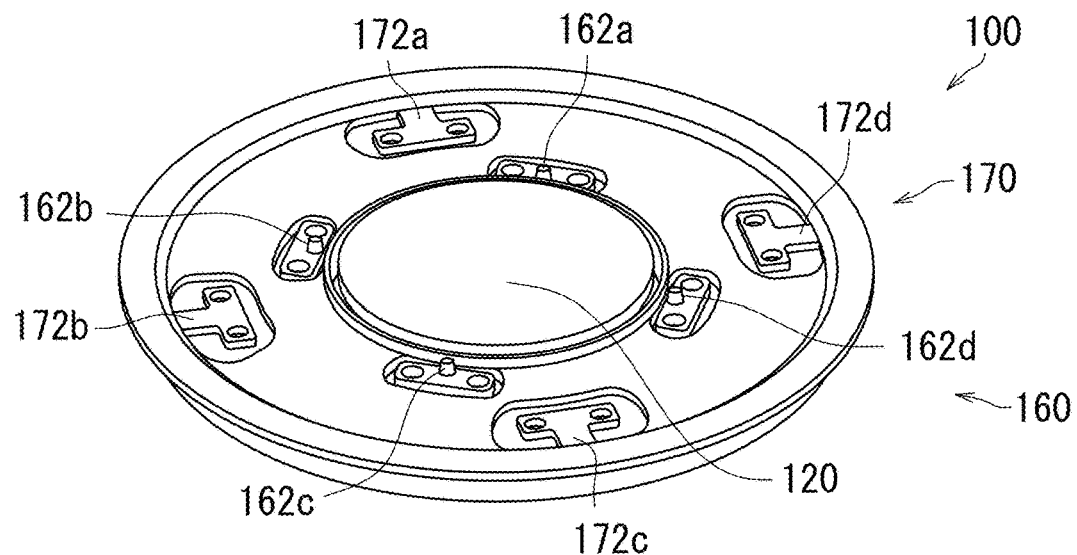
FIGS. 9A to 9C are schematic illustrations depicting cleaning liquid feeders in a substrate processing apparatus according to the present embodiment.

Cleaning liquid feeders 160, and 170 in a substrate processing apparatus 100 according to the present embodiment will next be described with reference to FIGS. 9A and 9C. FIG. 9A is a schematically perspective view of a substrate holder 120, and the cleaning liquid feeders 160, and 170 in the substrate processing apparatus 100 according to the present embodiment. As illustrated in FIG. 9A, nozzles 162a, 162b, 162c, and 162d of the cleaning liquid feeder 160 are disposed in the vicinity of the substrate holder 120, while nozzles 172a, 172b, 172c, and 172d of the cleaning liquid feeder 170 are disposed apart from the substrate holder 120.

Figure 9B:
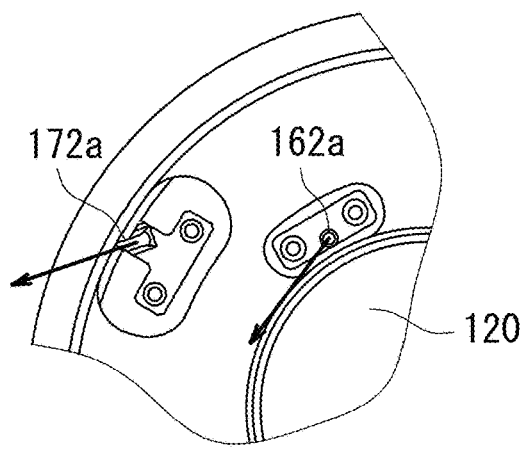

FIG. 9B is an enlarged partial top view of the substrate holder 120, and the cleaning liquid feeders 160, and 170 in the substrate processing apparatus 100 according to the present embodiment. As illustrated in FIG. 9B, the tip of the nozzle 162a is directed upward in a circumferential direction, while the tip of the nozzle 172a is directed upward in a direction represented by sum of a segment of the circumferential direction, and a segment of a radial direction.

Figure 9C:
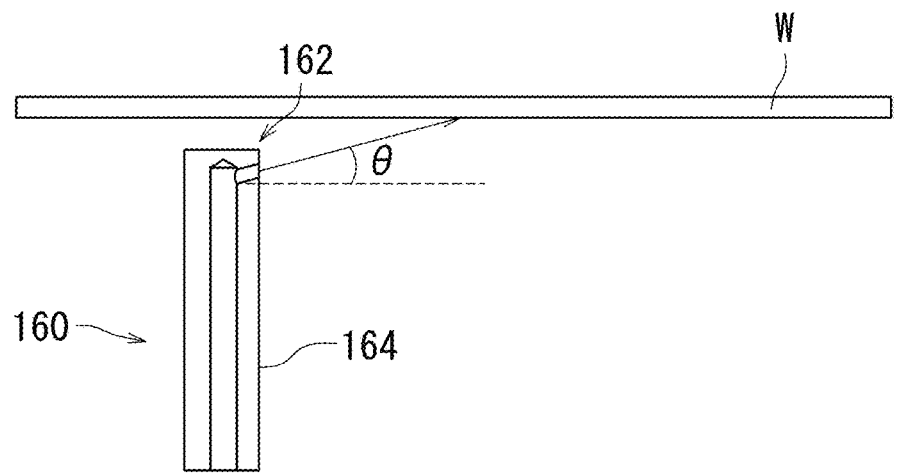

FIG. 9C is an enlarged partial cross-sectional side view of the cleaning liquid feeder 160 in the substrate processing apparatus 100 according to the present embodiment. As illustrated in FIG. 9C, a feed pipe 164 of the cleaning liquid feeder 160 is perpendicular to the substrate W, and elongated in a vertical direction. The nozzle 162 is located at the tip of the feed pipe 164. The nozzle 162 is provided so as to be directed diagonally upward at a predetermined angle θ relative to the horizontal. Examples of the angle θ may include not less than 5° and not greater than 25°, and not less than 10° and not greater than 20°. Examples of the distance between the substrate W and the nozzle 162 in the ejection direction of the nozzle 162 may include not less than 1 mm and not greater than 20 mm, and not less than 1 mm and not greater than 15 mm.

A substrate processing apparatus 100 according to the present embodiment will next be described with reference to FIGS. 10A to 11. The substrate processing apparatus 100 according to the present embodiment differs from each substrate processing apparatus 100 described with reference to FIGS. 1 and 7 in that chambers 110 (FIGS. 1 and 7) and chambers 210 are provided. Duplicate descriptions are therefore omitted for the purpose of avoiding redundancy.

Figure 10A:
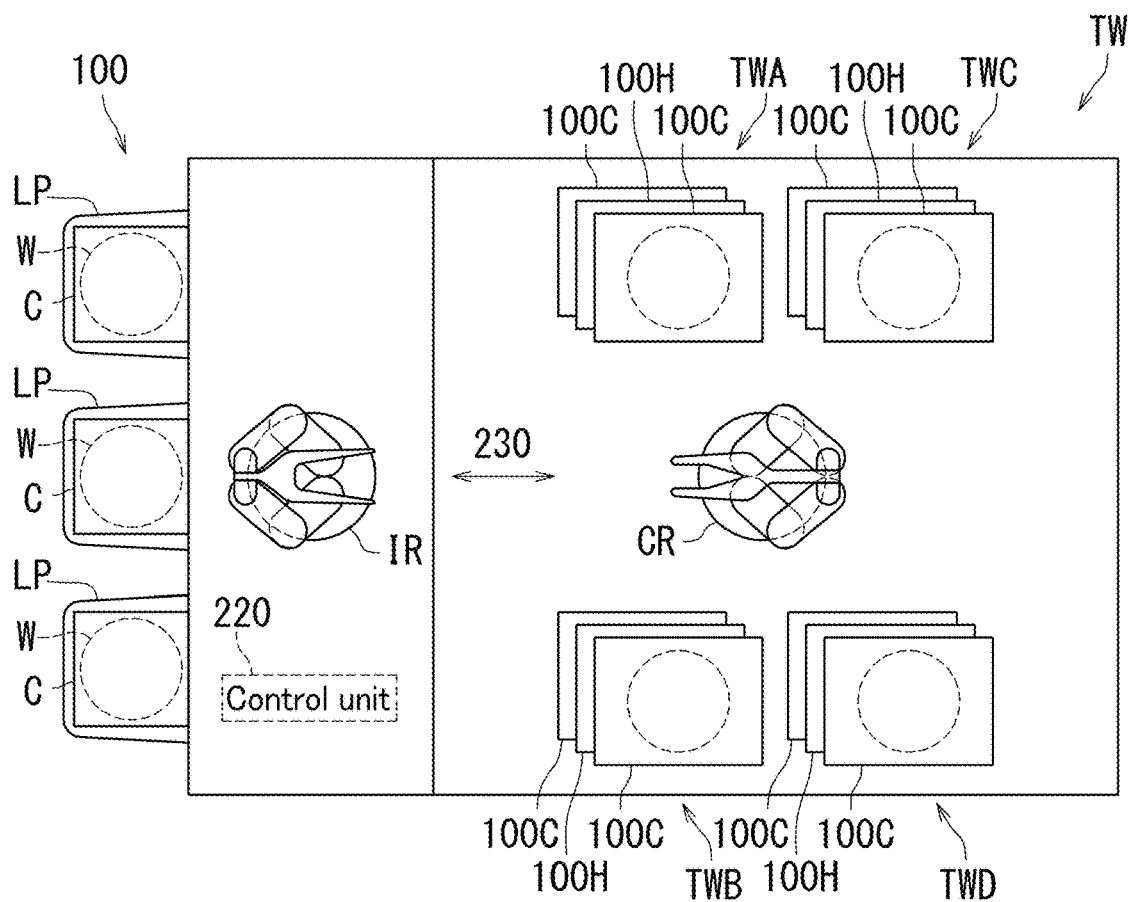
FIGS. 10A and 10B are schematic illustrations depicting a substrate processing apparatus according to the present embodiment.
Figure 10B:
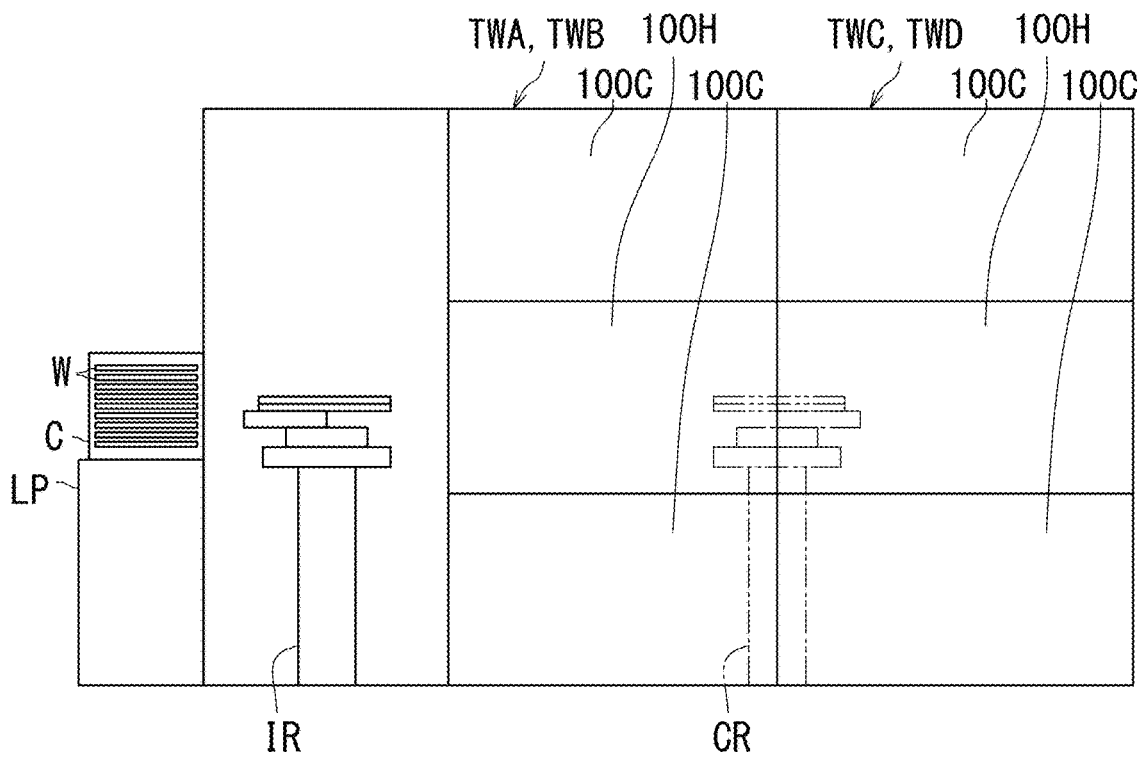

FIG. 10A is a schematic plan view of the substrate processing apparatus 100. FIG. 10B is a schematic elevation illustrating a configuration of the substrate processing apparatus 100. The substrate processing apparatus 100 is classified as a single wafer type, and performs, one substrate each, various processes such as cleaning and etching of a substrate W to be processed such as a semiconductor wafer.

Figure 12:
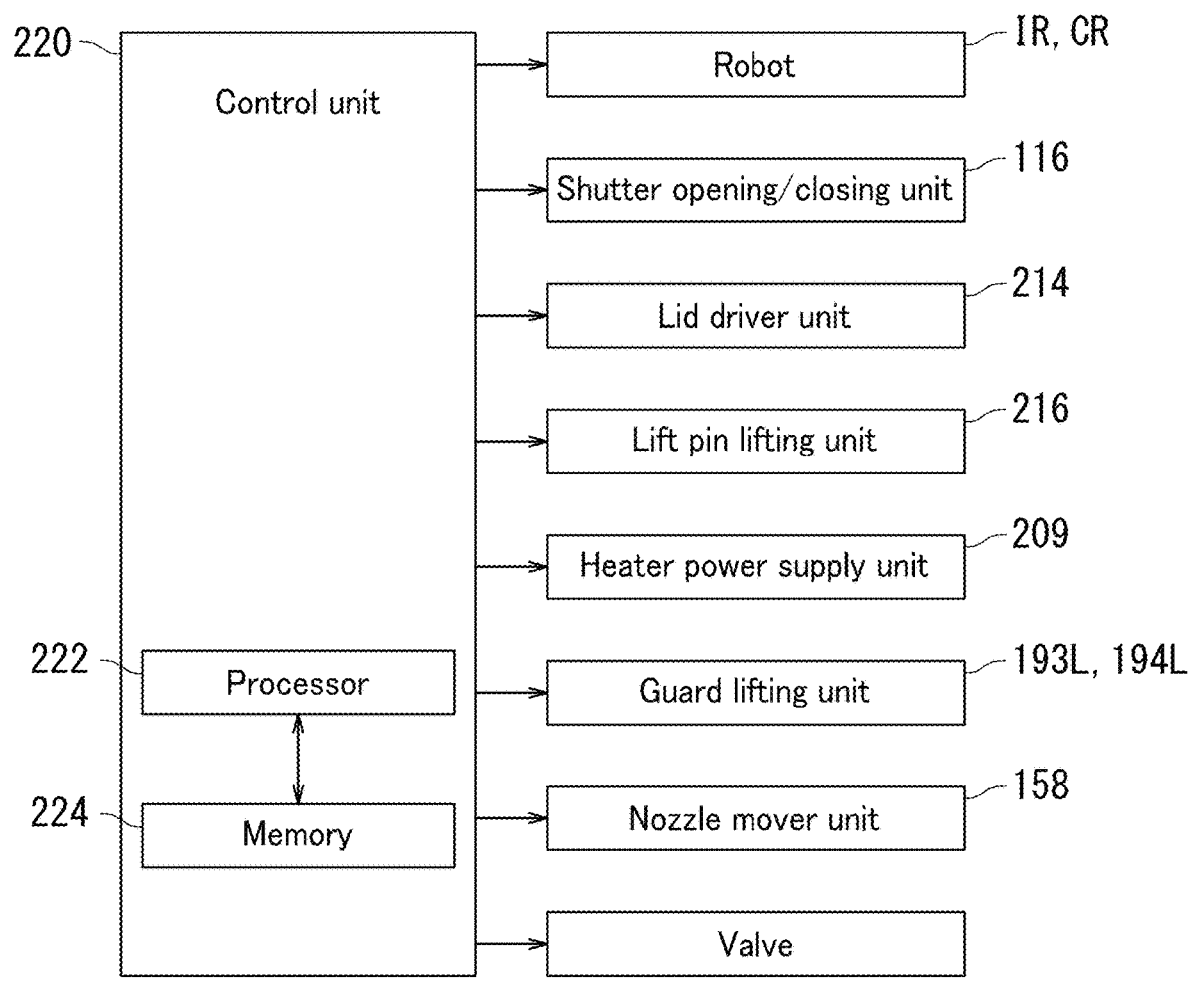
FIG. 12 is a block diagram of the substrate processing apparatus according to the present embodiment.

As illustrated in FIGS. 10A, and 10B, the substrate processing apparatus 100 includes liquid processing units 100C provided for each of the chambers 110, heat treatment units 100H provided for each of the chambers 210, load ports LP, an indexer robot IR, a center robot CR, and a control unit 220. A carrier C that houses substrates W is placed on each load port LP. The control unit 220 controls the load ports LP, the indexer robot IR, the center robot CR, the liquid processing units 100C, and the heat treatment units 100H. As illustrated in FIG. 12, the control unit 220 includes a processor 222, and memory 224.

Each of the load ports LP houses the substrates W in a stacked manner. The indexer robot IR conveys a substrate W to be processed between each load port LP and the center robot CR. The center robot CR conveys the substrate W between the indexer robot IR and each liquid processing unit 100C. Each of the liquid processing units 100C ejects a processing liquid thereof to a substrate W to be processed, thereby processing the substrate W.

Specifically, the liquid processing units 100C are arranged so as to surround the center robot CR in plan view, thereby forming processing towers TW (in FIG. 10A, four processing towers TW). Each of the processing towers TW includes the heat treatment unit 100H and liquid processing units 100C stacked on top and bottom thereof.

The substrate processing apparatus 100 further includes a conveyance path 230 elongated in a horizontal direction. The conveyance path 230 is elongated in a straight line from the indexer robot IR to the center robot CR. The processing towers TW are arranged symmetrically across the conveyance path 230. The processing towers TW are disposed on both sides of the conveyance path 230 so as to be arranged side by side in the elongated direction of the conveyance path 230. In the present embodiment, the processing towers TW are disposed with two processing towers TW being on each side of the conveyance path 230.

Of the processing towers TW, two processing towers TW on the near side to the indexer robot IR are referred to as first and second processing towers TWA and TWB. The first and second processing towers TWA and TWB are opposed to each other across the conveyance path 230. Of the processing towers TW, two processing towers TW on the far side from the indexer robot IR are referred to as third and fourth processing towers TWC and TWD. The third and fourth processing towers TWC and TWD are opposed to each other across the conveyance path 230.

The first and third processing towers TWA and TWC are disposed side by side along the conveyance path 230. The second and fourth processing towers TWB and TWD are also disposed side by side along the conveyance path 230.

The first processing tower TWA includes two liquid processing units 100C, and one heat treatment unit 100H. In the same way as the first processing tower TWA, each of the second to fourth processing towers TWB to TWD also includes two liquid processing units 100C, and one heat treatment unit 100H. Note that the liquid processing units 100C have an identical configuration. The heat treatment units 100H have an identical configuration.

As illustrated in FIG. 10B, in the first processing tower TWA, a liquid processing unit 100C, a heat treatment unit 100H, and a liquid processing unit 100C are stacked with the heat treatment unit 100H interposed between the two liquid processing units 100C. Like the first processing tower TWA, in each of the second to fourth processing towers TWB to TWD, a liquid processing unit 100C, a heat treatment unit 100H, and a liquid processing unit 100C are stacked with the heat treatment unit 100H interposed between the two liquid processing units 100C.

Figure 11:
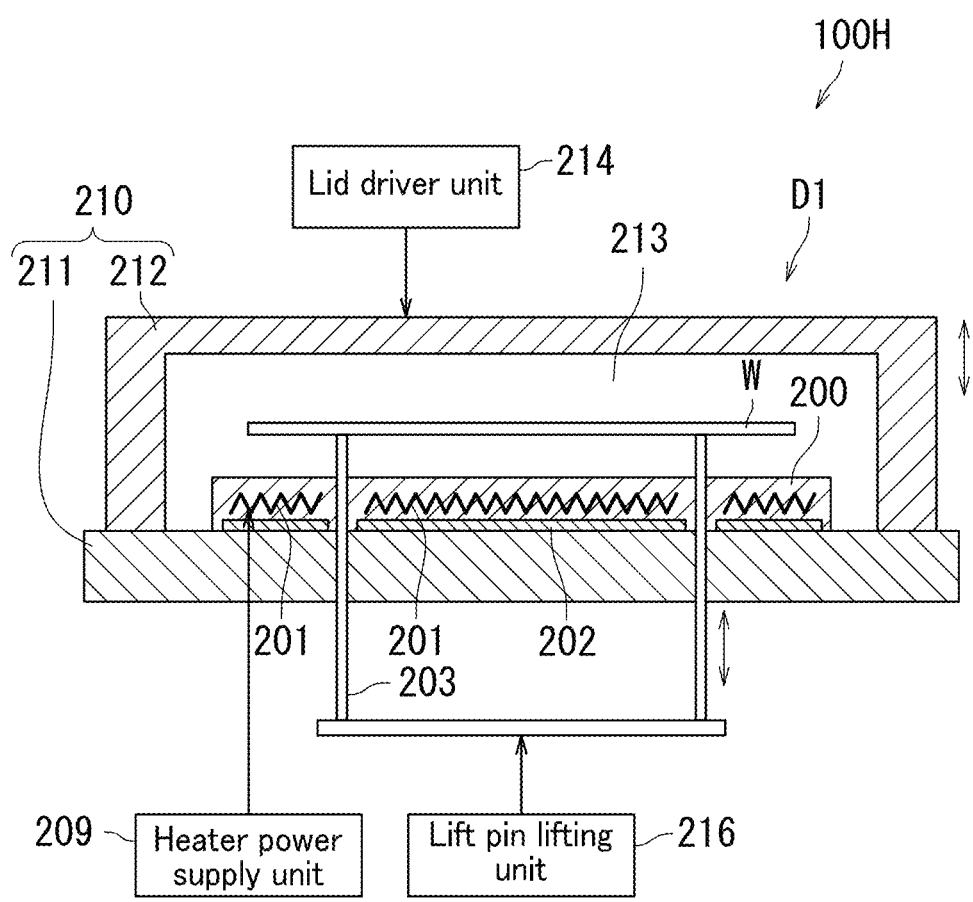
FIG. 11 is a schematic illustration of a heat treatment unit in the substrate processing apparatus according to the present embodiment.

FIG. 11 is a schematic diagram illustrating one of the heat treatment units 100H in the substrate processing apparatus 100 according to the present embodiment. The heat treatment unit 100H includes a chamber 210, a substrate holder 200 that holds a substrate W to be processed, a heater 201 (substrate heating unit) that heats the substrate W, a cooler unit 202 that cools the substrate W, and lift pins 203 for lifting the substrate W up and down.

The substrate holder 200 is a plate member that supports the substrate W in a horizontal posture from below. The substrate holder 200 is included in a substrate holding unit that holds the substrate W in the horizontal posture. The substrate holder 200 is housed in the chamber 210.

The heater 201, and the cooler unit 202 are built in the substrate holder 200. The heater 201, the cooler unit 202, and the substrate holder 200 constitute a temperature adjustment plate. The heater 201 heats the substrate W by heat transfer or heat radiation. The heater 201 is connected to a heater power supply unit 209 that supplies electric power to the heater 201. The heater 201 serves to heat the substrate W to about 250° C.

An electromagnetic wave exposure unit that heats the substrate W by exposing it to electromagnetic waves (examples thereof include ultraviolet rays, infrared rays, microwaves, X-rays, and laser beams) may be used in place of the heater 201. The cooler unit 202 may have a cooling passage that passes inside the substrate holder 200. The cooler unit 202 may have a thermoelectric cooling device.

The lift pins 203 are inserted into respective through holes that are pieced in the substrate holder 200. A lift pin lifting unit 216 causes the lift pins 203 to lift up and down between an upper position and a lower position. When the lift pins 203 are located in the upper position, the substrate W is separated upward from the substrate holder 200. When the lift pins 203 are located in the lower position, the upper ends of the lift pins 203 are retracted into the substrate holder 200. Thus, the substrate W is supported from below by the substrate holder 200.

The chamber 210 has a base 211, and a movable lid 212 that is movable up and down relative to the base 211. The base 211 and the movable lid 212 form an internal space 213 of the chamber 210. A lid driver unit 214 lifts the movable lid 212 up and down between an upper position and a lower position. When the movable lid 212 is located in the lower position, the movable lid 212 is in contact with the base 211. Thus, the chamber 210 is closed. When the movable lid 212 is located in the upper position, the center robot CR is allowed to access the internal space 213 of the chamber 210.

FIG. 12 is a block diagram of the substrate processing apparatus 100 according to the present embodiment. As illustrated in FIG. 12, the control unit 220 includes a microcomputer to control a control target equipped for the substrate processing apparatus 100 in accordance with a prescribed program.

Specifically, the control unit 220 includes the processor 222, and the memory 224 in which the program is stored. The control unit 220 is configured to perform various controls for substrate processing as a result of the processor 222 executing the program. In particular, the control unit 220 controls respective operations of the indexer robot IR, the center robot CR, shutter opening/closing units 116, the lid driver units 214, the lift pin lifting units 216, the heater power supply units 209, a first guard lifting unit 193L, a second guard lifting unit 194L, and valves 128, 133, 138, 146, 156, and 166.

Figure 13:
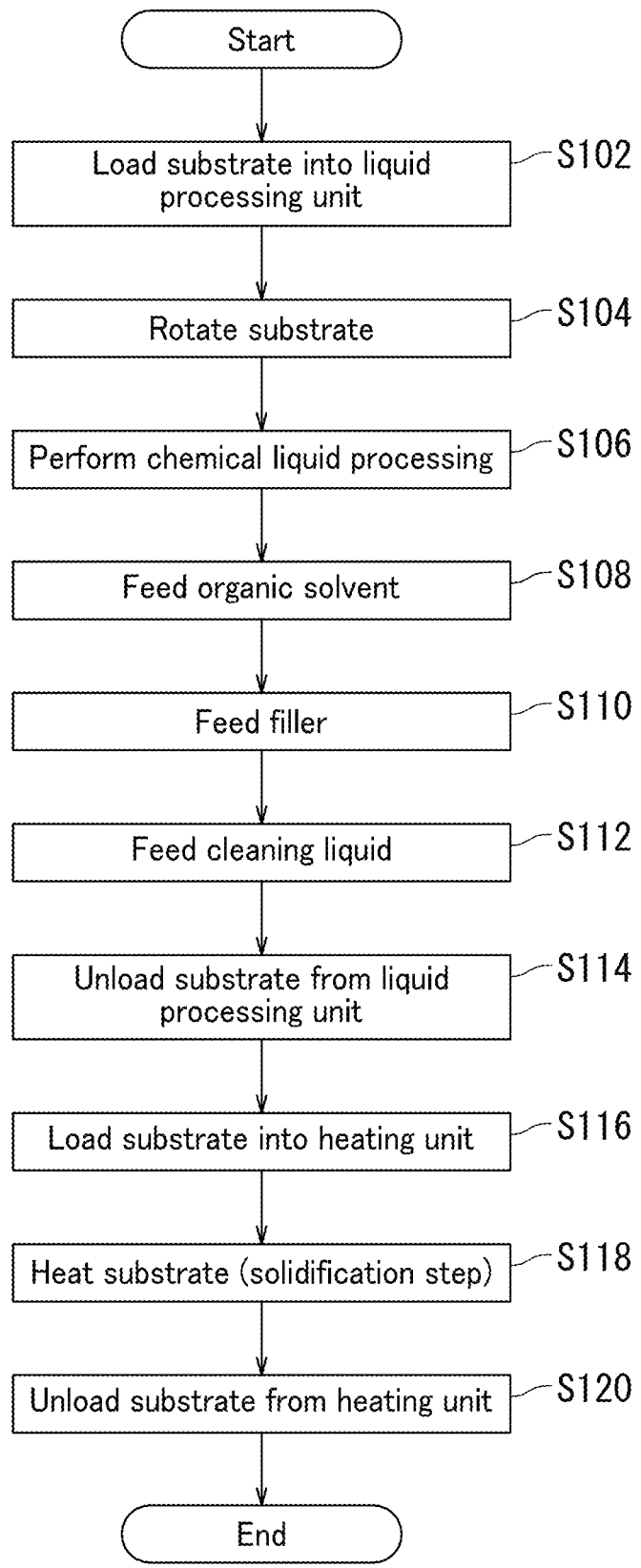
FIG. 13 is a flow chart illustrating a substrate processing method according to the present embodiment.

A substrate processing by the substrate processing apparatus 100 will next be described with reference to FIGS. 1, 7, and 10A to 15C. FIG. 13 is a flow chart illustrating the substrate processing by the substrate processing apparatus 100, and mainly depicts processing realized by the control unit 220 executing the program. Each of FIGS. 14A to 14C, and 15A to 15C is a schematic illustration depicting the substrate processing.

The substrate processing apparatus 100 performs continuous processing of substrates W. During the continuous processing of substrates W, the heater 201 of each heat treatment unit 100H is in an energized state by a corresponding heater power supply unit 209 (see FIG. 12).

Figure 14A:
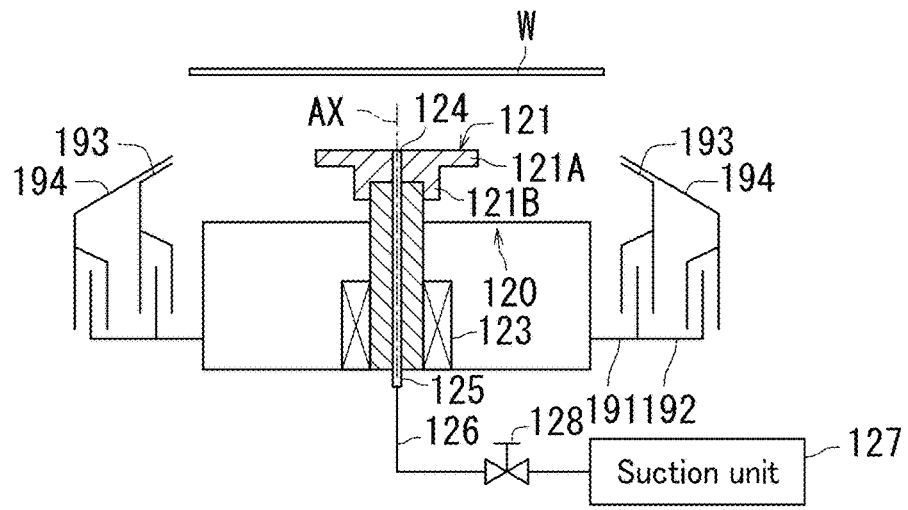
FIGS. 14A to 14C are schematic illustrations depicting a substrate processing method according to the present embodiment.

As illustrated in FIG. 14A, the indexer robot IR, and the center robot CR (FIGS. 10A and 10B) first convey a substrate W to be processed from a carrier C of the substrate W to a liquid processing unit 100C (first loading step: S102). The center robot CR accesses the liquid processing unit 100C through the entrance 112 thereof (FIGS. 1 and 7). The substrate W conveyed to the liquid processing unit 100C is transferred to the substrate holder 120 by the center robot CR. The substrate W is placed on the spin base 121 so that the upper side of the substrate W faces upward.

The valve 128 is then opened. The substrate W is accordingly held by the substrate holder 120 with the rear side of the substrate W being in contact with the upper surface of the spin base 121 (first substrate holding step). The substrate W is still held and kept in a horizontal position until the substrate W is unloaded from the liquid processing unit 100C by the center robot CR.

Figure 14B:
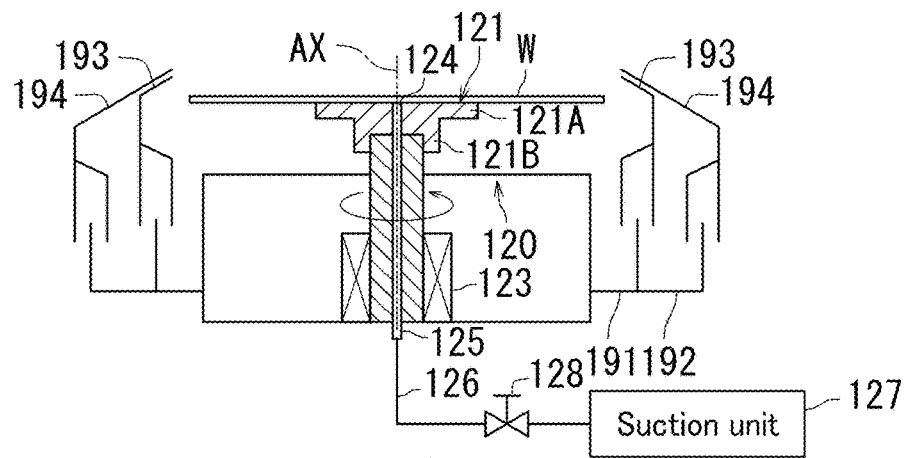

As illustrated in FIG. 14B, the electric motor 123 then starts rotating the substrate W (substrate rotating step: S104). The first, and second guard lifting units 193L, and 194L lift respective first, and second guards 193, and 194 up to the side of the substrate W.

Figure 14C:
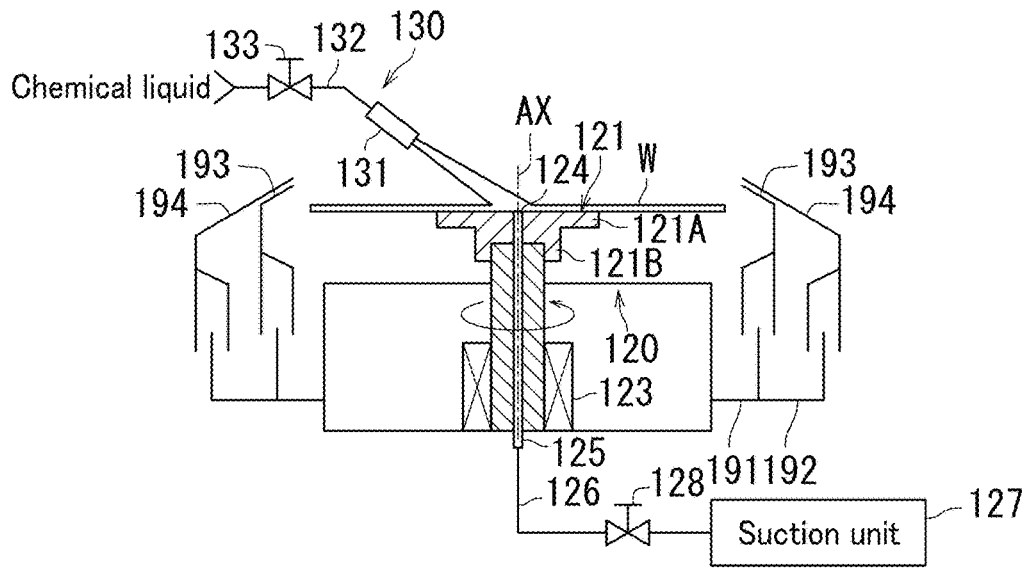

As illustrated in FIG. 14C, the valve 133 is then opened, and the chemical liquid feeder 130 starts feeding, from the nozzle 131, a chemical liquid to the upper side of the substrate W. The chemical liquid fed to the upper side of the substrate W spreads over the entire upper side of the substrate W by centrifugal force. The substrate W is thus processed by the chemical liquid (chemical liquid processing step: S106). The chemical liquid discharged outward from the substrate W by the centrifugal force is received by the first guard 193.

Figure 15A:
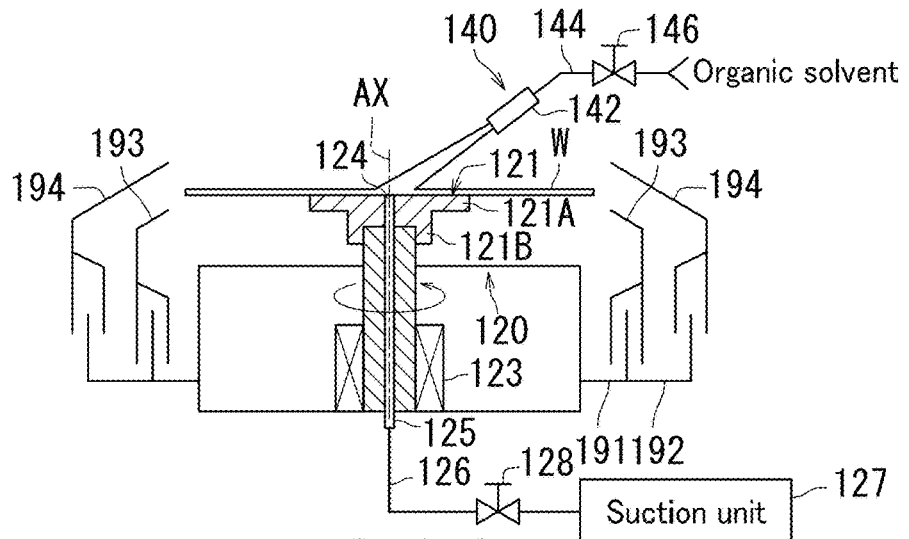
FIGS. 15A to 15C are schematic illustrations depicting a substrate processing method according to the present embodiment.

After the chemical liquid is fed to the upper side of the substrate W for a certain time, the valve 133 is shut. Before an organic solvent is ejected, the first guard lifting unit 193L lifts the first guard 193 down in the lower position, and the valve 146 is opened. As shown in FIG. 15A, the organic solvent feeder 140 accordingly starts feeding, from the nozzle 142, the organic solvent to the upper side of the substrate W (organic solvent feeding step: S108). The organic solvent fed to the upper side spreads over the entire upper side by the centrifugal force. The chemical liquid on the substrate W is accordingly exchanged for the organic solvent. The chemical liquid and the organic solvent discharged outward from the substrate W by the centrifugal force are received by the second guard 194.

Figure 15B:
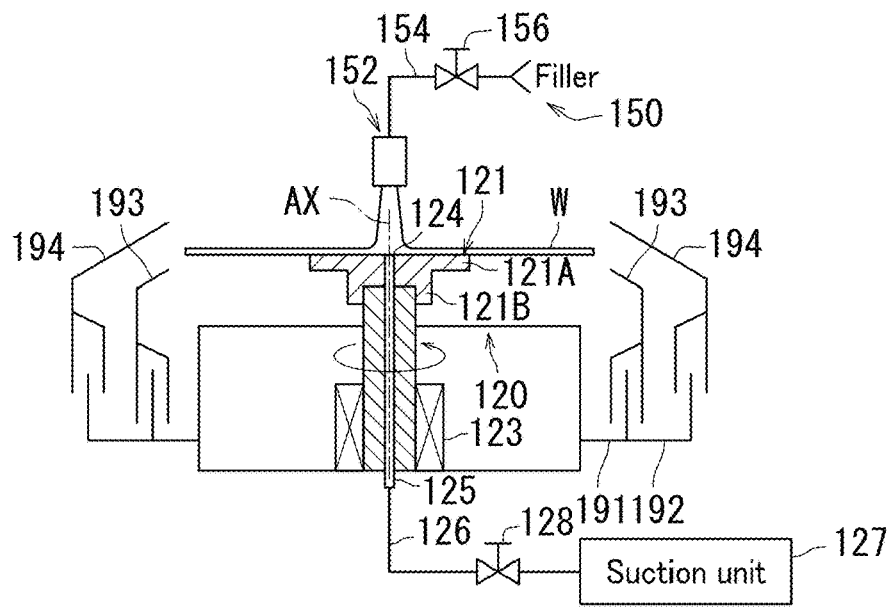

While the organic solvent is being fed to the upper side, the nozzle 152 is moved by a nozzle mover unit 158 above a central position of the substrate W. After the organic solvent is fed to the upper side of the substrate W for a certain time, the valve 146 is shut, and the valve 156 is opened. As illustrated in FIG. 15B, the filler feeder 150 accordingly starts feeding, from the nozzle 152, filler to the upper side of the substrate W (filler feeding step: S110). The filler fed to the upper side of the substrate W spreads over the entire upper side of the substrate W by centrifugal force. The organic solvent on the substrate W is accordingly exchanged for the filler. The upper side of the substrate W is consequently covered with a liquid film of the filler. The organic solvent and the filler discharged outward from the substrate W by the centrifugal force are received by the second guard 194. Just after ejecting of the filler ends, the nozzle 152 is moved in a retraction position before a cleaning liquid is ejected.

Figure 15C:
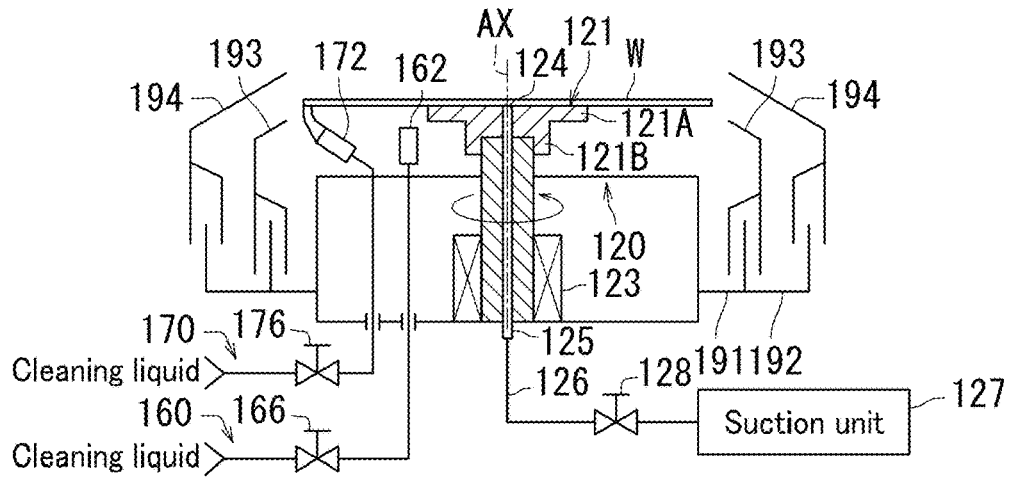

The filler fed to the upper side of the substrate W from the nozzle 152 may spread toward the rear side of the substrate W from the periphery of the upper side. The filler scattering outside the upper side of the substrate W may be returned by the first, and second guards 193, and 194 to adhere to the periphery of the rear side. The valves 166, and 176 are therefore opened after the upper side of the substrate W is covered with the liquid film of the filler. As illustrated in FIG. 15C, the cleaning liquid feeders 160, and 170 then start feeding, from their respective nozzles 162, and 172, respective cleaning liquids to the rear side of the substrate W (cleaning liquid feeding step: S112). The respective cleaning liquids ejected from the nozzles 162, and 172 are fed to the rear side of the substrate W, and thereby the rear side of the substrate W is cleaned. The liquid film of the filler makes it possible to prevent the rear side from easily being contaminated. The cleaning liquid feeder 160 thus functions as a cleaning unit.

The valves 166, and 176 are then shut, and the second guard 194 is moved in the lower position. The electric motor 123 then stops rotating the substrate W. The valve 128 is then shut.

The shutter opening/closing unit 116 (FIGS. 1, and 7) subsequently opens the shutter 114 again. The center robot CR then accesses the liquid processing unit 100C through the entrance 112, thereby unloading the substrate W from the liquid processing unit 100C (first unloading step: S114).

The center robot CR then loads the substrate W into a corresponding heat treatment unit 100H (FIG. 11) (second loading step: S116). At this moment, the lid driver unit 214 locating the movable lid 212 in the upper position enables the center robot CR to access the heat treatment unit 100H. The substrate W is then held in a horizontal position by the substrate holder 200 (second substrate holding step). Specifically, after the substrate W is placed on the lift pins 203 located in the upper position, the lift pins 203 are lifted down in the lower position by the lift pin lifting unit 216. The substrate W is thus placed on the upper surface of the substrate holder 200. The center robot CR then retracts from the heat treatment unit 100H. The lid driver unit 214 subsequently locates the movable lid 212 in the lower position. Thus, the chamber 210 is closed.

In the heat treatment unit 100H, the substrate W is heated by the heater 201 built in the substrate holder 200 (substrate heating step: S118). The filler covering the upper side of the substrate W is accordingly solidified (solidification step). Specifically, a solvent contained in the filler evaporates, and only the component solidified remains on the upper side. Thus, a sublimable coating film covering the upper side of the substrate W is formed. Performance of the solidification step ensures that such a coating film is formed.

Note that such a periphery cleaning step described above is performed before the start of the solidification step. The periphery of the rear side of the substrate W is therefore cleaned before the filler is solidified by the solidification step. It would therefore facilitate cleaning of the periphery of the rear side as compared with the periphery of the rear side being cleaned after the solidification of the filler. The lid driver unit 214 (FIG. 12) then locates the movable lid 212 in the upper position, and the lift pin lifting unit 216 lifts the lift pins 203 up in the upper position. The center robot CR then receives the substrate W from the lift pins 203 to unload the substrate W from the heat treatment unit 100H (second unloading step: S120). The process described above enables processing of the substrate W.

Note that the rotational speed for the substrate W may be changed according to the processing of the substrate W. For example, the rotational speed for the substrate W may be changed appropriately after the filler is fed to the substrate W.

Figure 16:
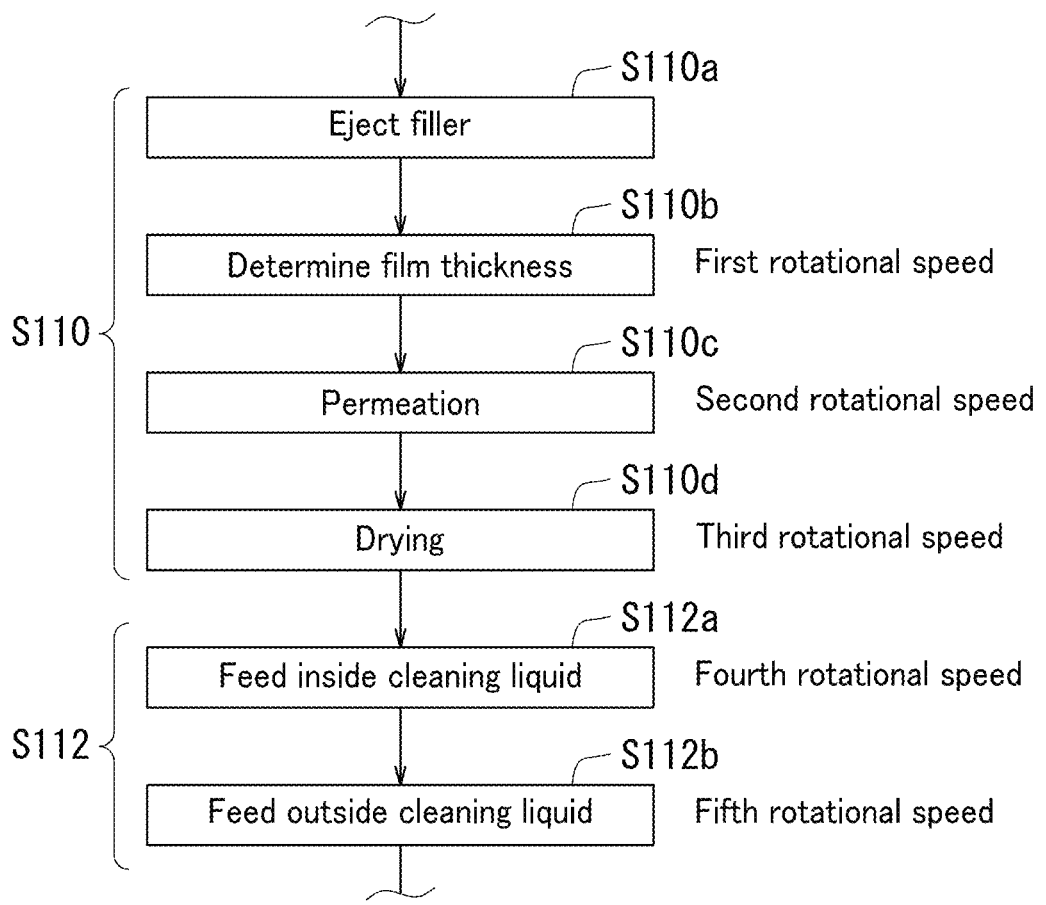
FIG. 16 is a flow chart illustrating a substrate processing method according to the present embodiment.

An embodiment in which a rotational speed for a substrate W is changed after filler is fed to a substrate W to be processed will be described with reference to FIG. 16. FIG. 16 is a flow chart illustrating a substrate processing method by a substrate processing apparatus according to the present embodiment. Note that the substrate processing method by the substrate processing apparatus according to the present embodiment is the same as the flow chart illustrated in FIG. 13 except details of the filler feeding step (S110), and the cleaning liquid feeding step (S112), and FIG. 16 therefore illustrates only a filler feeding step (S110), and a cleaning liquid feeding step (S112) in the present flow chart.

As illustrated in FIG. 16, in the filler feeding step (S110), a valve 156 is opened with an electric motor 123 rotating the substrate W, and a filler feeder 150 thereby starts feeding, from a nozzle 152 thereof, the filler to an upper side of the substrate W to eject a predetermined amount of filler (filler ejecting step: S110a). The valve 156 is subsequently shut, and the feeding of the filler to the upper side of the substrate W from the nozzle 152 is stopped.

The electric motor 123 subsequently rotates the substrate W at a first rotational speed. Thickness of a filler layer is determined by the amount of filler ejected and the first rotational speed (film thickness determining step: S110b). For example, the first rotational speed is not less than 1,000 rpm and not greater than 3,000 rpm.

The electric motor 123 subsequently rotates the substrate W at a second rotational speed. The second rotational speed is lower than the first rotational speed. Rotating the substrate W at the second rotational speed that is a comparatively low speed enables the fifer to spread over the entire upper side of the substrate W even if the substrate has a micro structure (permeation step: S110c). For example, the second rotational speed is not less than 10 rpm and not greater than 500 rpm.

The electric motor 123 subsequently rotates the substrate W at a third rotational speed. The third rotational speed is higher than the second rotational speed. Rotating the substrate W at the third rotational speed that is a comparatively high speed makes it possible to spin off remaining filler on the substrate and dry the substrate W (drying step: S110d). For example, the third rotational speed is not less than 1,000 rpm and not greater than 3,000 rpm.

A cleaning liquid feeder 160 subsequently feeds, from a nozzle 162 thereof, a cleaning liquid to the rear side of the substrate W. The cleaning liquid ejected from the nozzle 162 is fed to the rear side of the substrate W, thereby cleaning the rear side of the substrate W (cleaning liquid feeding step: S112).

As described above with reference to FIG. 7, in the case where the substrate processing apparatus 100 includes a second cleaning liquid feeder 170 in addition to the first cleaning liquid feeder 160, the cleaning liquid ejected from the nozzle 162 is first fed to the central area of a rear side of the substrate W, thereby cleaning the central area of the rear side of the substrate W (step of feeding inside cleaning liquid: S112a). In this case, the electric motor 123 rotates the substrate W at a fourth rotational speed. The fourth rotational speed is lower than the third rotational speed. Rotating the substrate W at the fourth rotational speed that is a comparatively low speed ensures that the rear side of the substrate W is cleaned by the cleaning liquid fed to the central area of the rear side of the substrate W. For example, the fourth rotational speed is not less than 10 rpm and not greater than 200 rpm.

A cleaning liquid ejected from a nozzle 172 is subsequently fed to the peripheral area of the rear side of the substrate W, and thereby cleaning the peripheral area of the rear side and the edge of the substrate W (step of feeding outside cleaning liquid: S112b). In this case, the electric motor 123 rotates the substrate W at a fifth rotational speed. The fifth rotational speed is higher than the fourth rotational speed. Rotating the substrate W at the fifth rotational speed that is a comparatively high speed ensures that the rear side, the edge, and the peripheral area of the upper side of the substrate W are cleaned by the cleaning liquid fed to the peripheral area of the rear side of the substrate W. For example, the fifth rotational speed is not less than 50 rpm and not greater than 2,000 rpm.

Note that although the step of feeding outside cleaning liquid (S112b) is performed after the step of feeding inside cleaning liquid (S112a) in the explanation with reference to FIG. 16, the present embodiment is not limited to this. The step of feeding inside cleaning liquid (S112a) may be performed after the step of feeding outside cleaning liquid (S112b). Here, a cleaning liquid fed to the rotating substrate W receives centrifugal force in a radial direction from the center of the substrate W toward the edge of the substrate W. Therefore, performing the step of feeding outside cleaning liquid (S112b) after the step of feeding inside cleaning liquid (S112a) makes it possible to sufficiently clean the central and peripheral areas of the rear side and the edge of the substrate W.

Also note that although the step of feeding outside cleaning liquid (S112b) is performed after the step of feeding inside cleaning liquid (S112a) in the explanation with reference to FIG. 16, the present embodiment is not limited to this. The respective cleaning liquids may be fed to the central and peripheral areas of the rear side of the substrate W at the same time.

Figure 17:
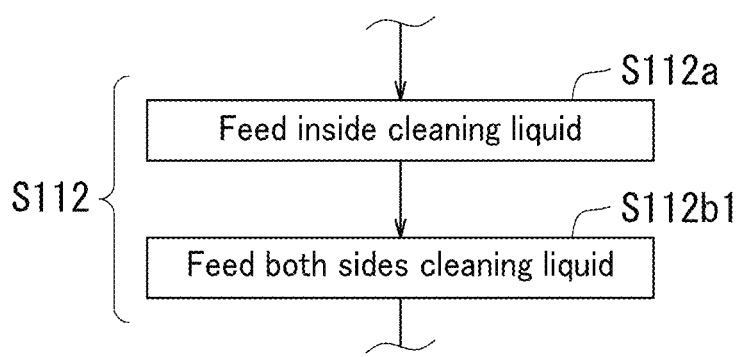
FIG. 17 is a flow chart illustrating a substrate processing method according to the present embodiment.

FIG. 17 is a flow chart illustrating a substrate processing method by a substrate processing apparatus according to the present embodiment. The substrate processing method by the substrate processing apparatus according to the present embodiment is the same as the flow charts illustrated in FIGS. 13, and 16 except the cleaning liquid feeding step (S112). FIG. 17 therefore illustrates only a cleaning liquid feeding step (S112) in the present flow chart.

As illustrated in FIG. 17, a cleaning liquid ejected from a nozzle 162 is fed to a rear side of a substrate W, thereby cleaning the central area of the rear side of the substrate W (step of feeding inside cleaning liquid: S112a).

Subsequently, ejecting the cleaning liquid from the nozzle 162 is continued, and ejecting a cleaning liquid from a nozzle 172 is started. The respective cleaning liquids from the nozzles 162 and 172 may be fed to the rear side of the substrate W at the same time, thereby cleaning the central area to the peripheral area of the rear side and the edge of the substrate W at the same time (step of cleaning liquid feeding to both sides: S112b1).

As described with reference to FIGS. 16 and 17, it is preferable that the peripheral area of the rear side of the substrate W and the edge of the substrate W be cleaned after the step of feeding inside cleaning liquid (S112a). This enables efficient cleaning and protect of the rear side of the substrate W in a period of time, after the filler ejecting step (S110a), during which an inside of a chamber 110 is easily caught in a contaminated atmosphere, and/or various liquids are easily returned by first and second guards 193 and 194. Cleaning the central area of the rear side of the substrate W before cleaning the peripheral area of the rear side and the edge of the substrate W makes it possible to keep the cleaning liquid, spreading toward the upper side of the substrate W, clean.

Note that although the step of feeding inside cleaning liquid (S112a) is performed after the drying step (S110d) in the above-described explanation with reference to FIGS. 16 and 17, the present embodiment is not limited to this. The step of feeding inside cleaning liquid (S112a) may be performed at the same time with the drying step (S110d). For example, the step of feeding outside cleaning liquid (S112b) may be performed, after the permeation step (S110c) is performed and then the step of feeding inside cleaning liquid (S112a) is performed at the same time with the drying step (S110d).

Although the step of feeding inside cleaning liquid (S112a) is performed after the drying step (S110d) in the above-described explanation with reference to FIGS. 16 and 17, the present embodiment is not limited to this. The step of feeding inside cleaning liquid (S112a) may be performed before the drying step (S110d). For example, the step of feeding outside cleaning liquid (S112b) may be performed after the step of feeding inside cleaning liquid (S112a) is performed at the same time with the permeation step (S110c), and subsequently the drying step (S110d) is performed.

Note that in the substrate processing apparatus 100, an inert gas is preferably fed to the rear side of the substrate W after a chemical liquid is fed to the substrate W. It is particularly preferable that the inert gas be fed to the rear side of the substrate W from a point in time before the filler is fed to the substrate W to a point in time when the cleaning liquid feeding step ends.

Figure 18:
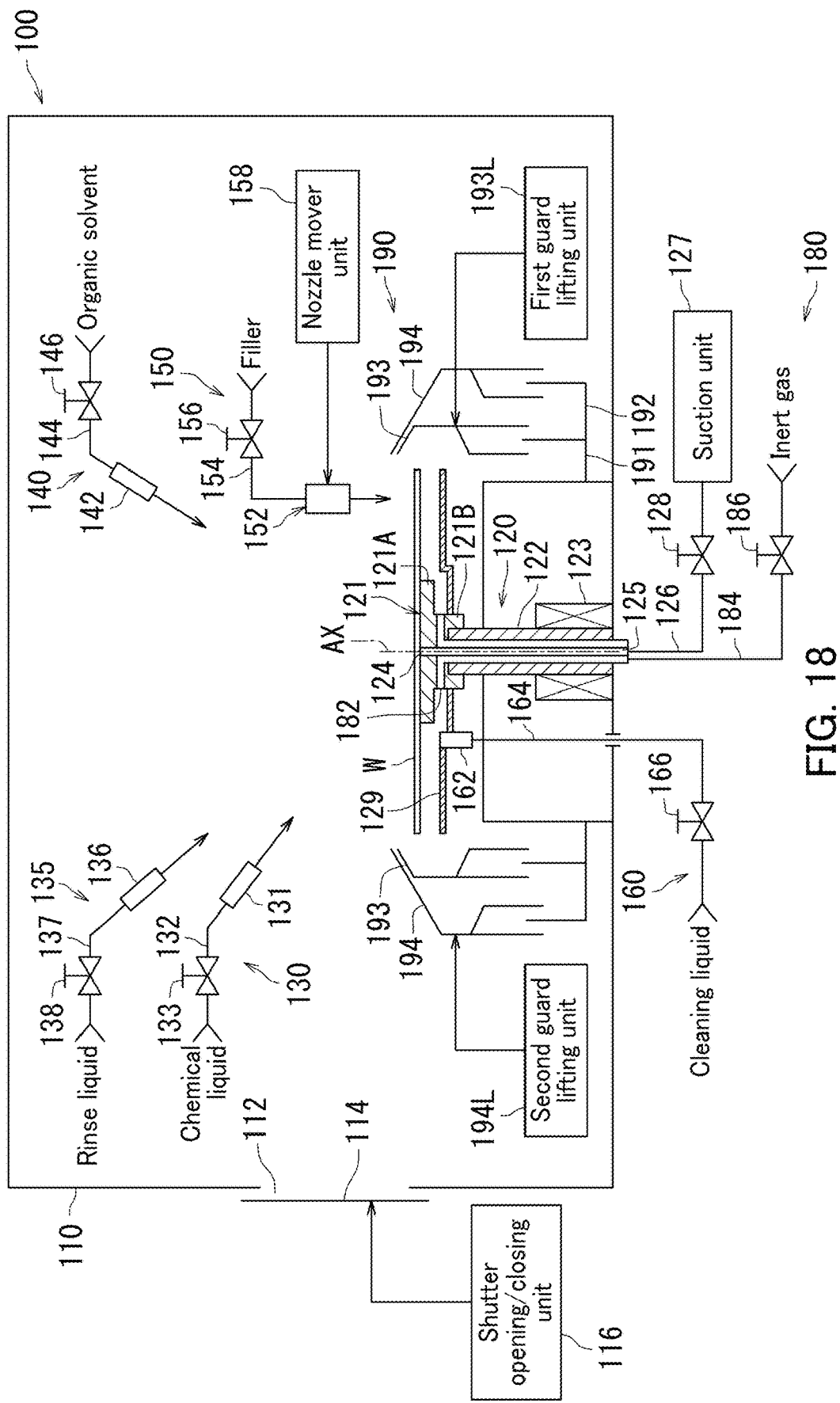
FIG. 18 is a schematic illustration depicting a substrate processing apparatus according to the present embodiment.

A substrate processing apparatus 100 including an inert gas feeder that feeds an inert gas to a rear side of a substrate W will next be described with reference to FIG. 18. FIG. 18 is a schematic illustration of the substrate processing apparatus 100 according to the present embodiment. The substrate processing apparatus 100 illustrated in FIG. 18 has a configuration similar to that of the substrate processing apparatus 100 described with reference to FIG. 1 except that the inert gas feeder 180 that feeds the inert gas to a cover plate 129, and the rear side of the substrate W is further provided. Duplicate descriptions are therefore omitted for the purpose of avoiding redundancy.

The inert gas feeder 180 feeds the inert gas to the rear side of the substrate W. Examples of the inert gas include nitrogen gas.

The inert gas feeder 180 includes a gas inlet 182, a feed pipe 184, and a valve 186. The inert gas ejected from the gas inlet 182 is fed to the rear side of the substrate W while passing between the substrate W and the cover plate 129. The gas inlet 182 is annular in shape, and provided in a periphery of a rotating shaft 122 of a substrate holder 120. The feed pipe 184 is joined to the rotating shaft 122 to communicate with the gas inlet 182. The gas inlet 182 is located at the tip of the rotating shaft 122. The inert gas is fed into the feed pipe 184 from a feed source. The feed pipe 184 is provided with the valve 186. The valve 186 opens and shuts an opening in a passageway inside the feed pipe 184.

Figure 19:
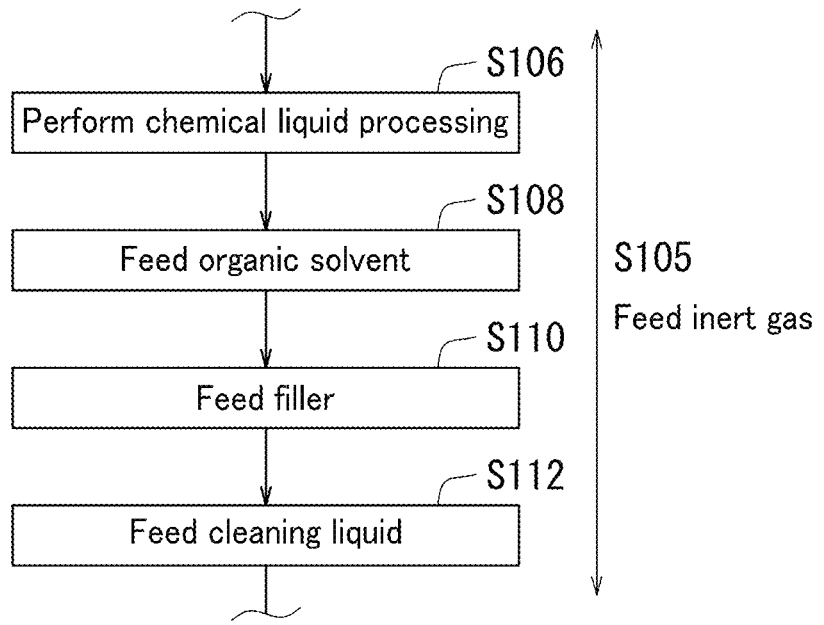
FIG. 19 is a flow chart illustrating a substrate processing method according to the present embodiment.

FIG. 19 is a flow chart illustrating a substrate processing method of feeding the inert gas, according to the present embodiment. As illustrated in FIG. 19, the inert gas is fed to the rear side of the substrate W from a start of a chemical liquid processing step (S106) to an end of a cleaning liquid feeding step (S112) (inert gas feeding step: S105).

The inert gas is fed to the rear side of the substrate W in the chemical liquid processing step (S106), an organic solvent feeding step (S108), a filler feeding step (S110), and the cleaning liquid feeding step (S112). In particular, feeding the inert gas to the rear side of the substrate W in the filler feeding step (S110), and the cleaning liquid feeding step (S112) makes it possible to prevent filler from easily adhering to the rear side of the substrate W.

Note that in the explanation described with reference to FIG. 19, the inert gas is fed from the start of the chemical liquid processing step (S106) to the end of the cleaning liquid feeding step (S112). An amount of the inert gas may be constant or varied for a period of time from the start of the chemical liquid processing step (S106) to the end of the cleaning liquid feeding step (S112).

Figure 20:
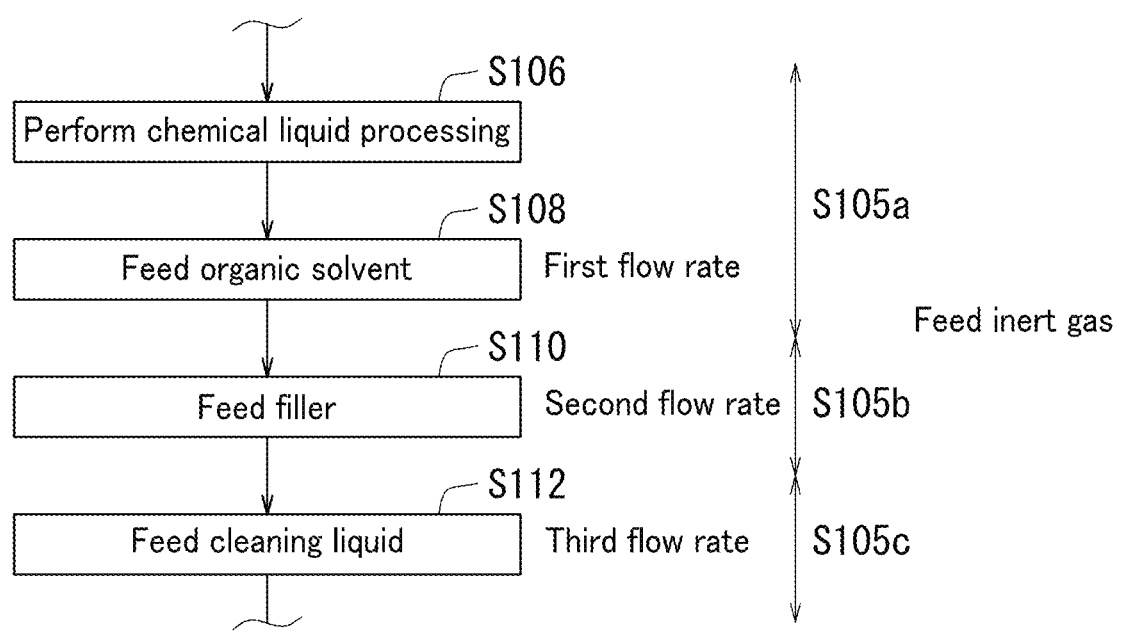
FIG. 20 is a flow chart illustrating a substrate processing method according to the present embodiment.

FIG. 20 is a flow chart illustrating a substrate processing method of varying an amount of an inert gas, according to the present embodiment. As illustrated in FIG. 20, the inert gas is fed at a first flow rate that is comparatively low in a chemical liquid processing step (S106) and an organic solvent feeding step (S108).

The inert gas is subsequently fed at a second flow rate higher than the first flow rate in a filler feeding step (S110) (inert gas feeding step: S105b). A flow rate of the inert gas is set to a third flow rate in a cleaning liquid feeding step (S112) (inert gas feeding step: S105c). The third flow rate of the inert gas in the cleaning liquid feeding step (S112) may be higher than the second flow rate of the inert gas in the filler feeding step (S110).

The flow rate of the inert gas in the filler feeding step (S110) being comparatively lower than the flow rate of the inert gas in the cleaning liquid feeding step (S112) make it possible to successfully feed filler to an upper side of a substrate W. The flow rate of the inert gas in the cleaning liquid feeding step (S112) being comparatively high also makes it possible to prevent the filler from easily adhering to the rear side of the substrate W.

Note that the second flow rate of the inert gas in the filler feeding step (S110) may equal the third flow rate of the inert gas in the cleaning liquid feeding step (S112).

Note that although, in the explanation described with reference to FIGS. 7 to 9C, and 15A to 15C, each substrate processing apparatus 100 includes a nozzle 162 that ejects a cleaning liquid for cleaning the central area of a rear side of a substrate W to be processed, and a nozzle 172 that ejects a cleaning liquid for cleaning the peripheral area of the rear side and an edge of the substrate W, the present embodiment is not limited to this. In a substrate processing apparatus 100 according to the present embodiment, not only the central area of a rear side of a substrate W but also the peripheral side of the rear side and an edge of the substrate W may be cleaned by a cleaning liquid ejected from the nozzle 162 that moves relative to the substrate W.

Figure 21:
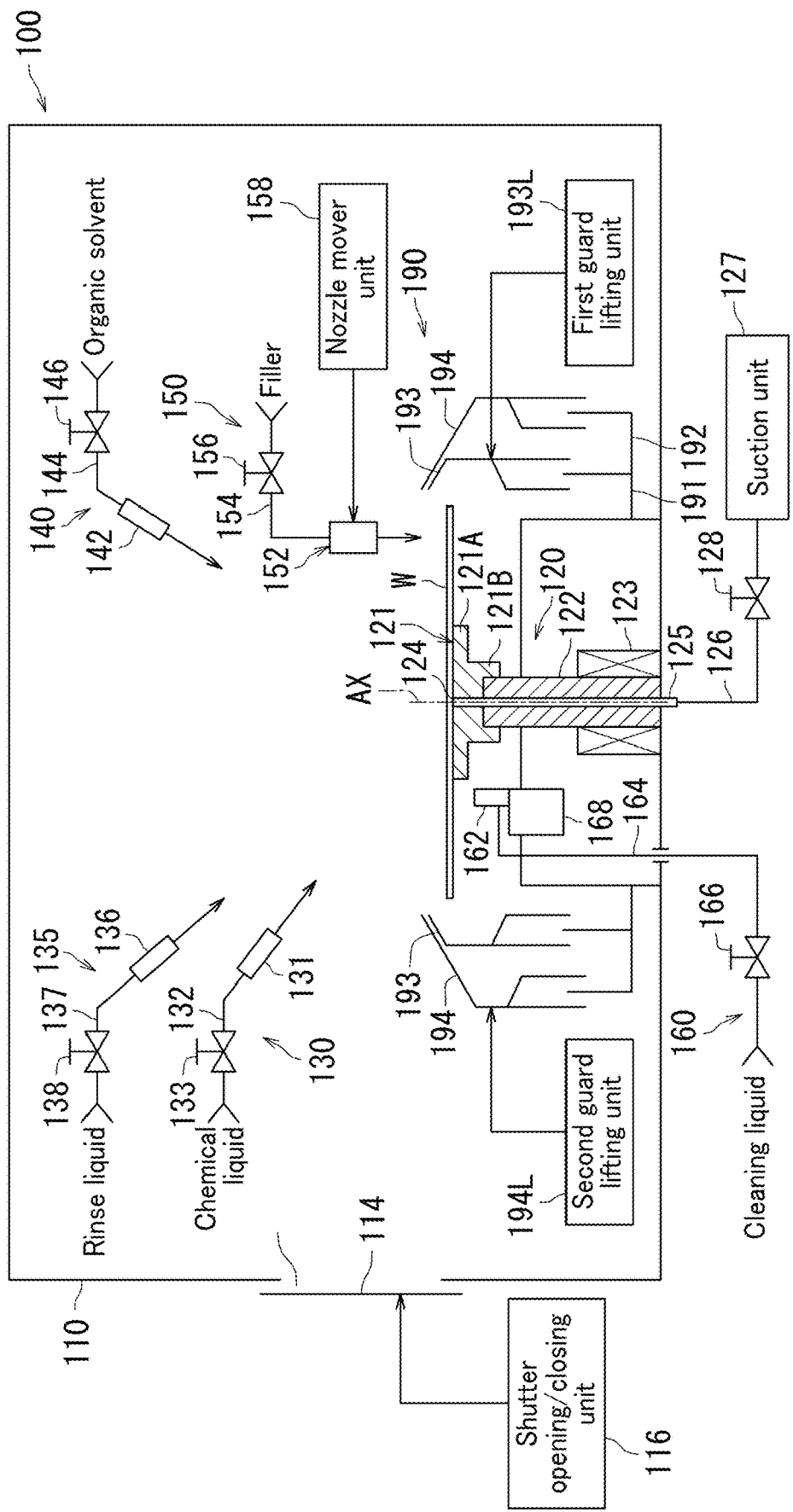
FIG. 21 is a schematic illustration of a substrate processing apparatus according to the present embodiment.

A substrate processing apparatus 100 having a movable nozzle 162 will next be described with reference to FIG. 21. FIG. 21 is a schematic illustration of the substrate processing apparatus 100 according to the present embodiment. The substrate processing apparatus 100 has a configuration similar to the substrate processing apparatus 100 described above with reference to FIG. 1 except that a first cleaning liquid feeder 160 further includes a nozzle mover 168 that moves the nozzle 162. Duplicate descriptions are therefore omitted for the purpose of avoiding redundancy.

The first cleaning liquid feeder 160 includes the nozzle mover 168 in addition to the nozzle 162, a feed pipe, and a valve 166. The nozzle mover 168 moves the nozzle 162. The nozzle mover 168 includes a motor, and a cylinder.

The nozzle mover 168 moves the nozzle 162 in a horizontal direction. The nozzle 162 ejects a cleaning liquid to the central area of a rear side of a substrate W. The nozzle 162 is moved relative to the substrate W by the nozzle mover 168, and then ejects a cleaning liquid to the peripheral area of the rear side of the substrate W.

The nozzle mover 168 may further include a temperature adjuster that adjusts a temperature of a cleaning liquid to be ejected from the nozzle 162. For example, the nozzle mover 168 includes a heater. The temperature of the cleaning liquid to be ejected from the nozzle 162 may be increased by the heater.

Note that although it has been explained with reference to FIG. 21 that the nozzle mover 168 moves one nozzle 168, the present embodiment is not limited to this. In the case where nozzles 162 are provided as described with reference to FIGS. 6A, 6B, 8, and 9A to 9C, it is preferable that the nozzle mover 168 individually move the nozzles 162.

Figure 22A:
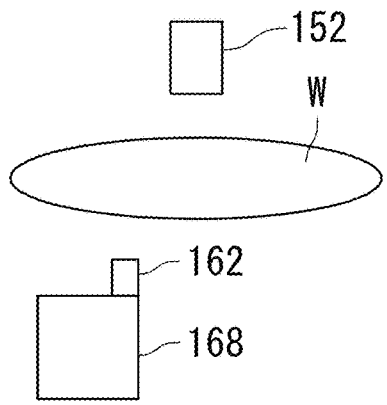
FIGS. 22A to 22D are schematic illustrations depicting a substrate processing method according to the present embodiment.
Figure 22B:
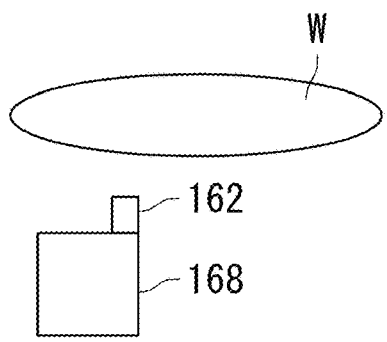
Figure 22C:
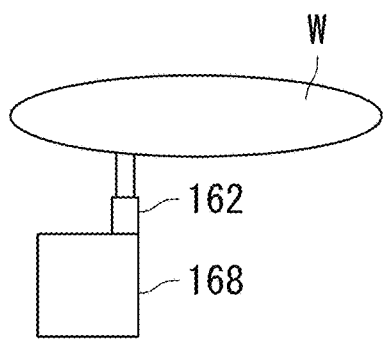
Figure 22D:
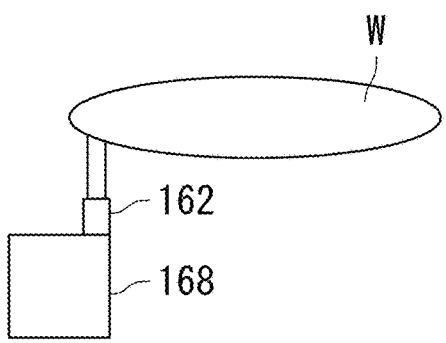

A substrate processing method by a substrate processing apparatus 100 according to the present embodiment will next be described with reference to FIGS. 16, 21, and 22A to 22D. FIGS. 22A to 22C are schematic illustrations depicting substrate processing by the substrate processing apparatus 100 according to the present embodiment.

As illustrated in FIG. 22A, a nozzle 152 ejects filler to a substrate W (filler ejecting step: S110a). At this moment, a substrate holder 120 rotates the substrate W at the first rotational speed.

As illustrated in FIG. 22B, the substrate holder 120 rotates the substrate W at the first rotational speed to determine a thickness of a film derived from the filler (film thickness determining step: S110b), rotates the substrate W at the second rotational speed to cause the filler to permeate the substrate W (permeation step: S110c), and then rotates the substrate W at the third rotational speed to dry the substrate W (drying step: S110d). Note that any one the film thickness determining step (S110b), the permeation step (S110c), and the drying step (S110d) may be omitted.

As illustrated in FIG. 22C, a nozzle 162 feeds a cleaning liquid to a rear side of the substrate W (step of feeding inside cleaning liquid: S112a). At this moment, a nozzle mover 168 has moved the nozzle 162 to the central area of the rear side of the substrate W, and in this state the nozzle 162 ejects the cleaning liquid to the central area of the rear side of the substrate W. Thus, the cleaning liquid ejected from the nozzle 162 is fed to the central area of the rear side of the substrate W, thereby cleaning the central area of the rear side of the substrate W. At this moment, the substrate holder 120 may rotate the substrate W at the fourth rotational speed.

As illustrated in FIG. 22C, the nozzle 162 feeds a cleaning liquid to the peripheral area of the rear side of the substrate W (step of feeding outside cleaning liquid: S112b). The nozzle mover 168 has moved the nozzle 162 in a direction from the central area toward the peripheral area of the rear side of the substrate W, during which the nozzle 162 ejects the cleaning liquid to the rear side of the substrate W. Thus, the cleaning liquid ejected from the nozzle 162 is fed from the central area to the peripheral area of the rear side of the substrate W, thereby cleaning the central area to the peripheral area of the rear side of the substrate W, and an edge of the substrate W. At this moment, the substrate holder 120 may rotate the substrate W at the fifth rotational speed. The nozzle mover 168 may also move the nozzle 162 up to the edge of the substrate W.

The embodiment of the present invention has been described so far with reference to FIGS. 1 to 22D. The present invention is however not limited to the above embodiment and may be implemented in various manners within a scope not departing from the gist of the present invention. Furthermore, various inventions may be formed by appropriately combining elements of configuration disclosed in the above embodiment. For example, some of the elements of configuration disclosed in the embodiment may be removed. In addition, elements of configuration from different embodiments may be appropriately combined. The drawings schematically illustrate main elements of configuration to facilitate understanding thereof. Aspects of the elements of configuration illustrated in the drawings, such as thickness, length, number and interval, may differ in practice for the sake of convenience for drawing preparation. Furthermore, aspects of the elements of configuration illustrated in the above embodiment, such as material, shape, and dimension, are one example and are not particularly limited. The elements of configuration may be variously altered within a scope not substantially departing from the configuration of the present invention.

What is claimed is:

1. A substrate processing apparatus, processing a substrate having an upper side and a rear side and comprising:
    a substrate holder configured to rotate the substrate while holding a central portion of the rear side of the substrate,
    a filler nozzle configured to feed filler to the upper side of the substrate held by the substrate holder, and
    a first nozzle configured to feed a cleaning liquid to the rear side of the substrate held by the substrate holder, wherein
    the first nozzle is directed toward the substrate such that an angle of a component of a travelling direction projected on the rear side of the substrate relative to a perpendicular direction along the rear side of the substrate is within a range of from 30° outward of the perpendicular direction in a radial direction of the substrate to 20° inward of the perpendicular direction in a direction opposite to the radial direction, the perpendicular direction being perpendicular to a direction from a center of the substrate toward a reaching point of the cleaning liquid on the rear side of the substrate, the travelling direction being a travelling direction of the cleaning liquid just before the cleaning liquid reaches the reaching point,
    the first nozzle is provided diagonally upward at a predetermined angle so as to be directed toward the rear side of the substrate, and
    the first nozzle feeds the cleaning liquid toward an area, held by the substrate holder, of the rear side of the substrate.

2. The substrate processing apparatus according to claim 1, wherein
    the substrate holder allows the substrate holder to stick to the central portion of the rear side of the substrate.

3. The substrate processing apparatus according to claim 1, wherein
    when feeding the cleaning liquid toward the area, held by the substrate holder, of the rear side of the substrate, the first nozzle feeds the cleaning liquid such that the cleaning liquid is spread on the rear side of the substrate and approaches the area, held by the substrate holder, of the rear side of the substrate without coming into contact with the area.

4. The substrate processing apparatus according to claim 1, further comprising:
    a second nozzle configured to feed a cleaning liquid to the rear side of the substrate held by the substrate holder, wherein
    a distance from the center of the substrate toward a reaching point on the substrate to which the first nozzle ejects a cleaning liquid is different from a distance from the center of the substrate toward a reaching point on the substrate to which the second nozzle ejects a cleaning liquid.

5. The substrate processing apparatus according to claim 4, wherein
    the cleaning liquid ejected from the first nozzle is different from the cleaning liquid ejected from the second nozzle.

6. The substrate processing apparatus according to claim 1, further comprising
    a motor or a cylinder configured to move the first nozzle in a horizontal direction.

7. The substrate processing apparatus according to claim 1, further comprising
    a third nozzle configured to feed a cleaning liquid for cleaning an edge of the substrate.

8. The substrate processing apparatus according to claim 7, wherein
    a distance from the center of the substrate to a point on the substrate to which the cleaning liquid from the third nozzle is fed is longer than a distance from the center of the substrate to a point on the substrate to which the cleaning liquid from the first nozzle is fed.

9. The substrate processing apparatus according to claim 1, wherein
    a component contained in the cleaning liquid is selected from the group consisting of isopropyl alcohol, propylene glycol monomethyl ether acetate, 1-ethoxy-2-propanol, and acetone.

10. The substrate processing apparatus according to claim 1, further comprising
    an inert gas nozzle configured to feed an inert gas to the rear side of the substrate.

11. The substrate processing apparatus according to claim 1, wherein
    the first nozzle feeds the cleaning liquid such that a distance between the reaching point of the cleaning liquid and the substrate holder is not less than 0.5 mm and not greater than 5.0 mm.

12. The substrate processing apparatus according to claim 1, wherein
    the first nozzle feeds the cleaning liquid such that a distance between the reaching point of the cleaning liquid and the substrate holder is not less than 0.8 mm and not greater than 4.0 mm.

* * * * *